(12) United States Patent
Kim et al.

(10) Patent No.: US 11,575,313 B2
(45) Date of Patent: Feb. 7, 2023

(54) DC-DC CONVERTER

(71) Applicant: LG INNOTEK CO., LTD., Seoul (KR)

(72) Inventors: Ji Hoon Kim, Seoul (KR); Geun Ho Kim, Seoul (KR); Hyun Min Na, Seoul (KR); Jae Hoo Jung, Seoul (KR); Seok Bae, Seoul (KR); Jai Hoon Yeom, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 17/575,992

(22) Filed: Jan. 14, 2022

(65) Prior Publication Data
US 2022/0247305 A1 Aug. 4, 2022

Related U.S. Application Data

(63) Continuation of application No. 16/343,963, filed as application No. PCT/KR2017/013090 on Nov. 17, 2017, now Pat. No. 11,251,694.

(51) Int. Cl.
*H02M 1/32* (2007.01)
*H02M 3/335* (2006.01)
*H05K 7/20* (2006.01)
*H05K 5/00* (2006.01)
*H05K 7/02* (2006.01)
(Continued)

(52) U.S. Cl.
CPC ......... *H02M 1/32* (2013.01); *H02M 3/33576* (2013.01); *H05K 1/02* (2013.01); *H05K 5/00* (2013.01); *H05K 7/02* (2013.01); *H05K 7/14* (2013.01); *H05K 7/20* (2013.01); *H02M 1/327* (2021.05)

(58) Field of Classification Search
CPC ................................ H02M 1/32; H02M 1/327
USPC ........................................................... 165/47
See application file for complete search history.

(56) References Cited

U.S. PATENT DOCUMENTS

2011/0149543 A1 6/2011 Kamoi et al.
2014/0096938 A1* 4/2014 Kojima .................... F28F 1/00
165/104.19
(Continued)

FOREIGN PATENT DOCUMENTS

CN 1211802 A 3/1999
CN 101309049 A 11/2008
CN 101754581 A 6/2010
(Continued)

*Primary Examiner* — Tomi Skibinski
(74) *Attorney, Agent, or Firm* — Birch, Stewart, Kolasch & Birch, LLP

(57) ABSTRACT

The present embodiment relates to a DC-DC converter including: a housing; a plurality of electronic components disposed inside the housing; and a flow path disposed on a lower plate of the housing. The flow path includes an expanding portion. The horizontal width of the expanding portion is greater than the horizontal width of a flow path on the front end of the expanding portion, and the vertical width of the expanding portion is less than the vertical width of the flow path on the front end of the expanding portion. The differential between the part wherein the surface area of the vertical cross section of the flow path is the biggest and the part wherein the surface area of the vertical cross section of the flow path is the smallest is 10% or less.

13 Claims, 19 Drawing Sheets

(51) Int. Cl.
*H05K 7/14* (2006.01)
*H05K 1/02* (2006.01)

(56) References Cited

U.S. PATENT DOCUMENTS

2015/0233967 A1    8/2015  Thordarson et al.
2016/0270268 A1*   9/2016  Suzuki .............. H05K 7/20927

FOREIGN PATENT DOCUMENTS

| | | |
|---|---|---|
| CN | 102647884 A | 8/2012 |
| CN | 103594430 A | 2/2014 |
| CN | 204628931 U | 9/2015 |
| CN | 105376970 A | 3/2016 |
| CN | 105578849 A | 5/2016 |
| JP | 2001-8468 A | 1/2001 |
| JP | 2002-314280 A | 10/2002 |
| JP | 2003-234589 A | 8/2003 |
| JP | 2007-281403 A | 10/2007 |
| JP | 2007-295765 A | 11/2007 |
| JP | 2008-167650 A | 7/2008 |
| JP | 2010-11671 A | 1/2010 |
| JP | 2011-29480 A | 2/2011 |
| JP | 2011-172354 A | 9/2011 |
| JP | 2011-233726 A | 11/2011 |
| JP | 2012-146759 A | 8/2012 |
| JP | 2013-138541 A1 | 7/2013 |
| JP | WO2013/118222 A | 8/2013 |
| JP | 2014-45547 A | 3/2014 |
| JP | 2014-57484 A | 3/2014 |
| KR | 10-0959866 B1 | 5/2010 |
| KR | 10-1367071 B1 | 2/2014 |
| KR | 10-2017-0054092 A | 5/2017 |

\* cited by examiner

1000

DC-DC CONVERTER

CROSS REFERENCE TO RELATED APPLICATIONS

This application is a Continuation of U.S. application Ser. No. 16/343,963 filed on Apr. 22, 2019, which is the National Phase of PCT/KR2017/013090 filed on Nov. 17, 2017, which claims priority under 35 U.S.C. § 119(a) to Patent Application Nos. 10-2016-0153088; 10-2016-0180862; 10-2017-0148773; 10-2017-0152770; and 10-2017-0152771 filed in the Republic of Korea on Nov. 17, 2016; Dec. 28, 2016; Nov. 9, 2017; Nov. 16, 2017; and Nov. 16, 2017 respectively, all of which are hereby expressly incorporated by reference into the present application.

TECHNICAL FIELD

The present exemplary embodiment relates to a DC-DC converter.

BACKGROUND ART

The following description provides background information for the present embodiment and does not describe the prior art.

With the emergence of environmentally friendly vehicles using electric power, it is required to reduce the weight and size of electric parts for vehicles. A DC-DC (direct current to direct current) converter for a vehicle is a device for controlling a DC voltage in a vehicle.

Particularly, in an electric vehicle, it plays the role of changing voltage of a current generated in a motor so as to supply to a battery. In addition, when the electric vehicle is driving down an inclined road, the motor serves as a generator to charge the battery. In this case, the voltage of the electric current generated by the motor is changed and supplied to the battery.

Various electronic components are disposed in the DC-DC converter. It is necessary to improve the cooling efficiency of a heating module for various reasons such as weight reduction of the DC-DC converter and implementation of a compact structure.

On the other hand, the main configuration of the DC-DC converter comprises a primary coil through which a current supplied from the outside flows, a secondary coil which generates an induced current by a current flowing through the primary coil, and an inductor coil electrically connected to the secondary coil and controlling the frequency of a converted current. More specifically, the conversion of the current is accomplished through the electromagnetic interaction between the primary coil and secondary coil, and the converted current is filtered through the inductor coil to filter the noise frequency and then supplied to an external device via a bus bar. Generally, each of the secondary coil, the inductor coil, and the bus bar is separately manufactured as a single member through complicated processes such as sheet press cutting, bolt hole punching, bending, forging, and the like, and later, they are coupled together with bolts, thereby being connected electrically. However, such a manufacturing process is too complicated, and further, during bolt-coupling, there is a problem in that the coupling may be incomplete or a gap may be induced due to the warping of the material and the like. In particular, the gaps between the secondary coil and the inductor coil, and the inductor coil and the bus bar cause problems such as heat generation due to an increase in contact resistance as well as deterioration in electrical characteristics. In addition, since the secondary coil, the inductor coil, and the bus bar are independently manufactured as a single member, there is a problem in that the size and the weight of the DC-DC converter increase.

Meanwhile, the DC-DC converter may comprise a housing and a cooling plate disposed in the housing in the form of a horizontal partition so as to divide the housing into a first region and a second region. In addition, a cooling flow path is formed in the first region through which cooling water flows, and electronic components (for example, boards for mounting various devices) are disposed in the second region. That is, the first region performs a function of cooling the electronic component part with the cooling part, and the second region performs an electronic control function of converting the voltage of the external power source for the electronic component part. Recently, researches are being carried out to reduce the size of the DC-DC converter and to improve the cooling efficiency of the electronic component parts due to the request of the vehicle manufacturers and the emergence of smart and hybrid automobiles.

DETAILED DESCRIPTION OF THE INVENTION

Technical Subject

In the first embodiment, a DC-DC converter which improves cooling efficiency of a heating module is provided.

In the second embodiment, a DC-DC converter which simplifies the manufacturing processes and improves the conversion efficiency by integrally forming a secondary coil, an inductor coil, and a bus bar, and comprising a coil module having a compact structure is provided.

In the third embodiment, a DC-DC converter having a reduced size and a high cooling efficiency is provided.

Technical Solution

A DC-DC converter of the first embodiment comprises: a housing; a plurality of electronic components disposed inside the housing; and a flow path disposed on a lower plate of the housing, wherein the flow path comprises an expanding portion, and the horizontal width of the expanding portion is greater than the horizontal width of a flow path on the front end of the expanding portion, and the vertical width of the expanding portion is less than the vertical width of the flow path on the front end of the expanding portion, and the differential between the portion wherein the surface area of the vertical cross section of the flow path is the biggest and the portion wherein the surface area of the vertical cross section of the flow path is the smallest is 10% or less.

The plurality of electronic components may comprise a plurality of heating elements, and one of the plurality of heating elements may be disposed corresponding to the expanding portion.

The one of the plurality of heating elements may be overlapping with the expanding portion along the vertical direction.

The maximum horizontal cross section of the expanding portion, the area being overlapped in the vertical direction with the one of the plurality of heating elements, may be greater than 30%.

The maximum horizontal cross section of the expanding portion may be greater than 90% of the one of the plurality of heating elements.

A protruding part downwardly protruded towards the lower plate may be located.

The height of the protruding part may be increasing and then decreasing along the direction of the movement of the cooling material.

The area of the vertical cross section of the protruding part has the shape of a rectangle, and the area of the vertical cross section of the protruding part may be increasing and then decreasing along the direction of the movement of the cooling material.

The area of the horizontal cross section of the protruding part has a shape wherein the curvature is convexly formed towards the lower plate, and the area of the horizontal cross section of the protruding part may be decreasing as it travels from the center of the horizontal width of the flow path towards the edge.

The area of the vertical cross section of the flow path may be equal along the movement direction of the cooling material.

The plurality of electronic components may comprise a plurality of heating elements, and the plurality of heating elements may comprise a diode module, and the diode module may be disposed to correspond to the expanding portion in a vertical direction.

The flow path further comprises an inlet portion through which the cooling material sequentially moves, a first curved portion, a second curved portion, and a discharge portion, the inlet portion and the discharge portion being spaced apart in the horizontal width direction of the flow path, and the first curved portion and the expanding portion may be spaced apart in the horizontal width direction of the flow path.

The inlet portion and the discharge portion may be disposed parallel to each other, and the first curved portion may be formed in a way that the curvature is convexly formed in the direction wherein the expanding portion is located, and the second curved portion may be formed in a way that curvature is convexly formed in the direction opposite to the direction where a space between the first curved portion and the expanding portion is located.

The plurality of electronic components comprises a heating element, wherein the heating element comprises an inductor, a transformer, a Zero-Voltage-Switching (ZVS) inductor, a switching module, and a diode module; the inductor is disposed so as to correspond to a vertical direction with respect to the inlet portion; the transformer is arranged to correspond to the first curved portion in the vertical direction; the ZVS (Zero-Voltage-Switching) inductor is disposed so as to be vertically aligned with the front end of the second curved portion; the switching module is disposed to correspond to the second curved portion in the vertical direction; and the diode module may be disposed to correspond to the expanding portion in the vertical direction.

The inductor continuously controls the current flow; the transformer controls the power by changing the voltage of the current; the ZVS (Zero-Voltage-Switching) inductor controls the light load; the switching module controls ON/OFF of the current; and the diode module can control the direction of the current.

The housing comprises a side plate extending upward from the lower plate and an upper cover disposed on the side plate, and the plurality of electronic components can be disposed in a space formed by the lower plate, the side plate, and the top cover.

It may comprise: a connector electrically connected to an external electronic device; an inlet through which the cooling material flows into the flow path; and an outlet through which the cooling material is discharged from the flow path, wherein the connector is disposed on the side plate, the inlet and the outlet may be located on the opposite side of the connector and disposed on the side plate.

The housing comprises: a first sidewall extending downwardly from the lower plate; a second sidewall extending from the lower plate and spaced apart from the first sidewall; and a lower cover disposed below the first sidewall and the second sidewall, wherein the flow path may be formed by the lower plate, the first sidewall, the second sidewall, and the lower cover.

A ceiling surface of the flow path may be located on the lower plate; a bottom surface of the flow path may be located in the lower cover; and the side surface of the flow path may be located on the first sidewall and the second sidewall.

The vertical width of the flow path may be defined by the shortest vertical distance between the lower plate and the lower cover, and the horizontal width of the flow path may be defined by the shortest horizontal distance between the first sidewall and the second sidewall.

A DC-DC converter of the second embodiment may comprise: a primary coil; a secondary coil generating an induced current by the primary coil; a first terminal and a second terminal extending from the secondary coil; an inductor coil connected to the second terminal to rectify a current; and a third terminal extending from the inductor coil, wherein the first terminal, the primary coil, the second terminal, the inductor coil, and the third terminal may be integrally formed.

The secondary coil may have the shape of an open ring-type plate comprising an upper surface and a lower surface, and one end thereof may be connected to the first terminal and the other end thereof may be connected to the second terminal.

The inductor coil may have a shape of a plate comprising an upper surface and a lower surface grown as a three-dimensional spiral.

The inductor coil may be in the form of an angled spiral comprising a plurality of edge portions.

At least one of the first terminal, the second terminal, and the third terminal may comprise at least one of a bent portion and a curved portion.

A bidirectional current may flow through the first terminal, the secondary coil, the second terminal, the inductor coil, and the third terminal.

It may further comprise a first magnetic core wherein the secondary coil is disposed, and a second magnetic core wherein the inductor coil is disposed.

It may further comprise a bus bar extending from the third terminal, and the first terminal, the secondary coil, the second terminal, the inductor coil, the third terminal, and the bus bar thereof may be integrally formed.

The DC-DC converter of the second embodiment may comprises: a primary coil; a secondary coil and a tertiary coil generating an induced current by the primary coil; a first terminal and a second terminal extending from the secondary coil; a third terminal and a fourth terminal extending from the tertiary coil; a fifth terminal connected to the second terminal and the fourth terminal; an inductor coil extending from the fifth terminal to rectify a current; a sixth terminal extending from the inductor coil; and a bus bar extending from the sixth terminal, wherein the secondary coil, the first terminal, and the second terminal may be integrally formed, and the tertiary coil, the third terminal, and the fourth terminal may be integrally formed, and the fifth terminal, the inductor coil, the sixth terminal, and the bus bar may be integrally formed.

The secondary coil is disposed on the primary coil; the tertiary coil is disposed below the primary coil; the secondary coil is electrically connected to the diode module by the first terminal; and the tertiary coil may be electrically connected to the diode module by the third terminal.

A DC-DC converter of the third embodiment may comprises: a housing comprising a cooling plate; a cooling flow path disposed on one surface of the cooling plate; an insulating layer disposed on the other surface of the cooling plate; a pattern layer disposed on the insulating layer; an electric element disposed on the pattern layer; and a board spaced apart from the cooling plate and electrically connected to the pattern layer.

The electric element comprises an upper surface and a lower surface, and the lower surface of the electric element may be soldered to the pattern layer to face the cooling plate.

The cooling plate may be formed integrally with the housing.

A plurality of heat radiating fins may be formed on one surface of the cooling plate, and the heat radiating fins may be formed as protrusions extending to one side.

The first board and the second board may be electrically connected by soldering of a signal leg or by press-fit method.

The signal leg may comprise: a first conducting member forming a part of the pattern layer; and a second conducting member being curved or bent at the first conducting member and electrically connected to the board.

The signal leg may comprise: a first conducting member electrically connected to the pattern layer; and a second conducting member being curved or bent at the first conducting member and electrically connected to the board.

The signal leg is electrically connected to the pattern layer, and comprises a first conducting member in the form of a plate; and a second conducting member extending from the center of the first conducting member to the second board side and electrically connected to the board.

The signal leg may comprise a first conducting member forming a part of the pattern layer and having a groove formed at the center thereof in the form of a plate; and a second conducting member, formed with a protruding part which is accommodated in the groove of the first conducting member, extending from the protruding part toward the board, and being electrically connected to the board.

One end and the other end of the housing are open, and the housing may comprise: a first cover covering the opening of the one end; and a second cover covering the opening of the other end.

The insulating layer may be coated on the other surface of the cooling plate.

A DC-DC converter of the third embodiment comprises: a first region wherein a flow path of a cooling fluid is formed; a second region wherein the electronic component is disposed spaced apart from the first region; a cooling plate disposed between the first region and the second region; a main board spaced apart from the cooling plate and disposed in the second region; an insulating layer disposed on the cooling plate; a pattern layer disposed on the insulating layer; and an electric element disposed on the pattern layer.

Advantageous Effects

In the DC-DC converter of the first embodiment, since the difference in the area of the vertical cross section in all portions of the flow path is within 10%, the flow rate of the cooling material is increased and the pressure drop width is reduced, thereby enhancing the cooling efficiency. Further, electronic components (for example, a diode module) having a large heating value and a large area can be intensively cooled by matching with an expanding portion (a portion having a large horizontal width and a thin vertical width) of the flow path.

The second embodiment provides a DC-DC converter wherein a secondary coil, an inductor coil, and a bus bar are integrally formed by a casting process, thereby enhancing the conversion efficiency thereof, and comprising a coil module having a compact structure with reduced weight.

According to the third embodiment, the size of an electronic component assembly and a converter can be reduced by increasing the mounting density of the elements in the same space by stacking of a main board and an auxiliary board. Furthermore, by mounting an active element having a high heating value on the auxiliary board directly contacting the cooling plate, the cooling efficiency can be increased.

BEST MODE

Figure 1:
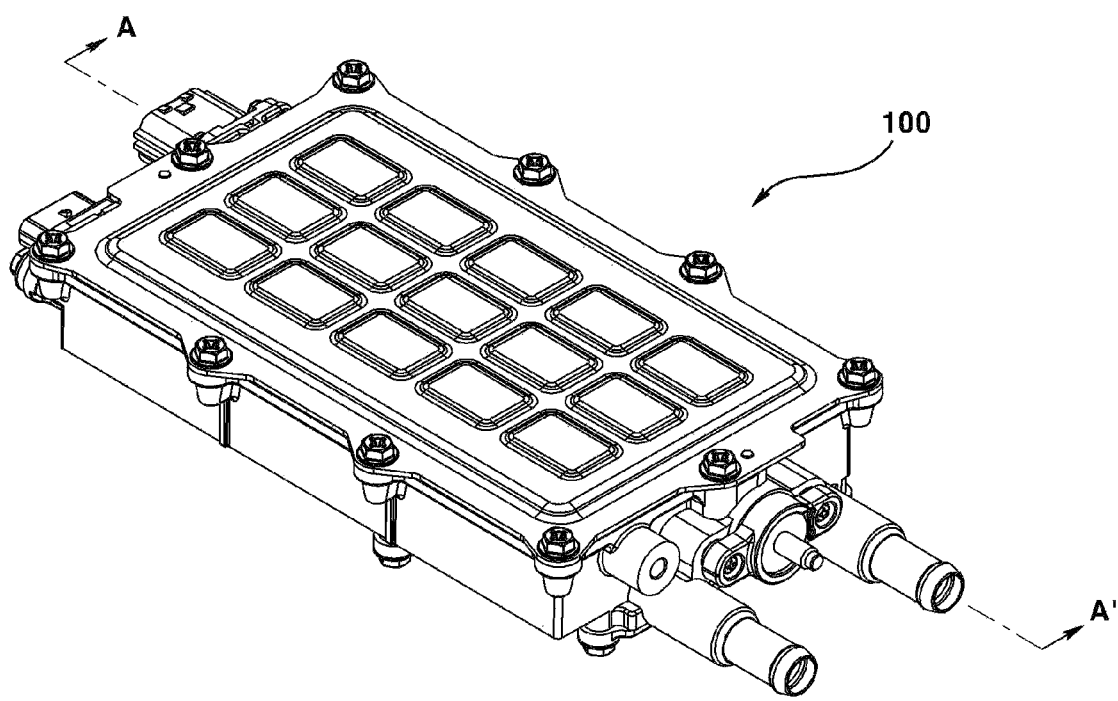
FIG. 1 is a perspective view of a DC-DC converter of the first embodiment viewed from above.

Hereinafter, some embodiments of the present invention will be described with reference to exemplary drawings. In describing the reference symbols of the components in the drawings, the same components are denoted by the same reference numerals whenever possible, even if they are shown on other drawings. In the following description of the embodiments of the present invention, a detailed description of known functions and configurations incorporated herein will be omitted when it may hinder the understanding of the embodiments of the present invention.

In describing the components of the embodiment of the present invention, terms such as first, second, A, B, (a), and (b) may be used. These terms are merely intended to distinguish the components from other components, and the terms do not limit the nature, order or sequence of the components. When a component is described as being "connected," "coupled," or "jointed" to another component, the component may be directly connected, coupled, or jointed to the other component, however, it should be understood that another element may be "connected," "coupled" or "jointed" between components.

First Embodiment

Hereinafter, "vertical direction" may mean upward and/or downward direction, and "horizontal direction" may mean any one of directions on a plane perpendicular to "vertical direction." The "vertical direction" may be the horizontal width direction of the flow path 200, and the "horizontal direction" may be the horizontal width direction of the flow path 200. The "vertical cross section" may mean a cross section perpendicular to the moving direction of the cooling material, and the "horizontal cross section" may be a cross section perpendicular to the "vertical cross section."

Figure 2:
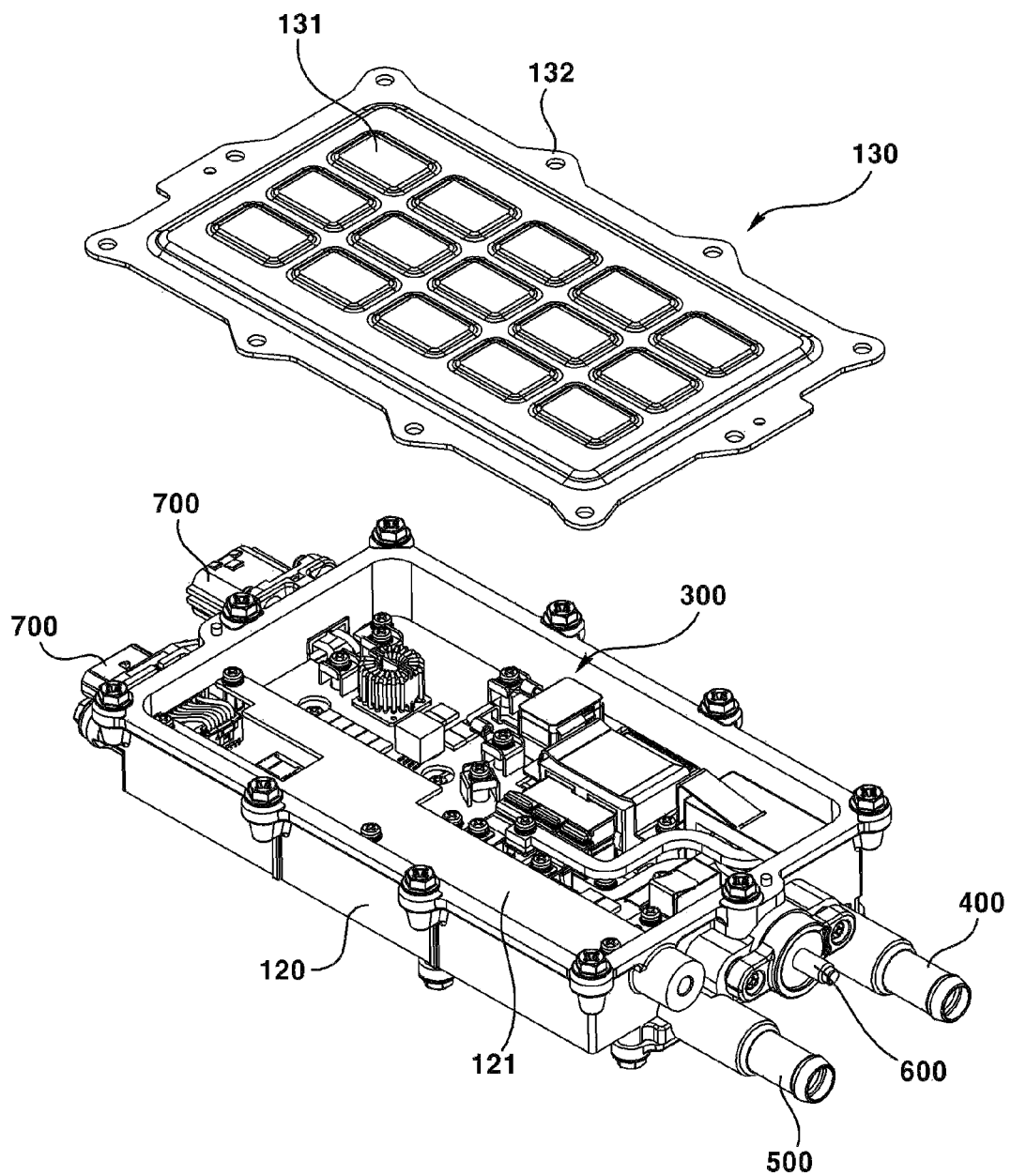
FIG. 2 is a perspective view of the DC-DC converter of the first embodiment wherein the upper cover is disassembled.
Figure 3:
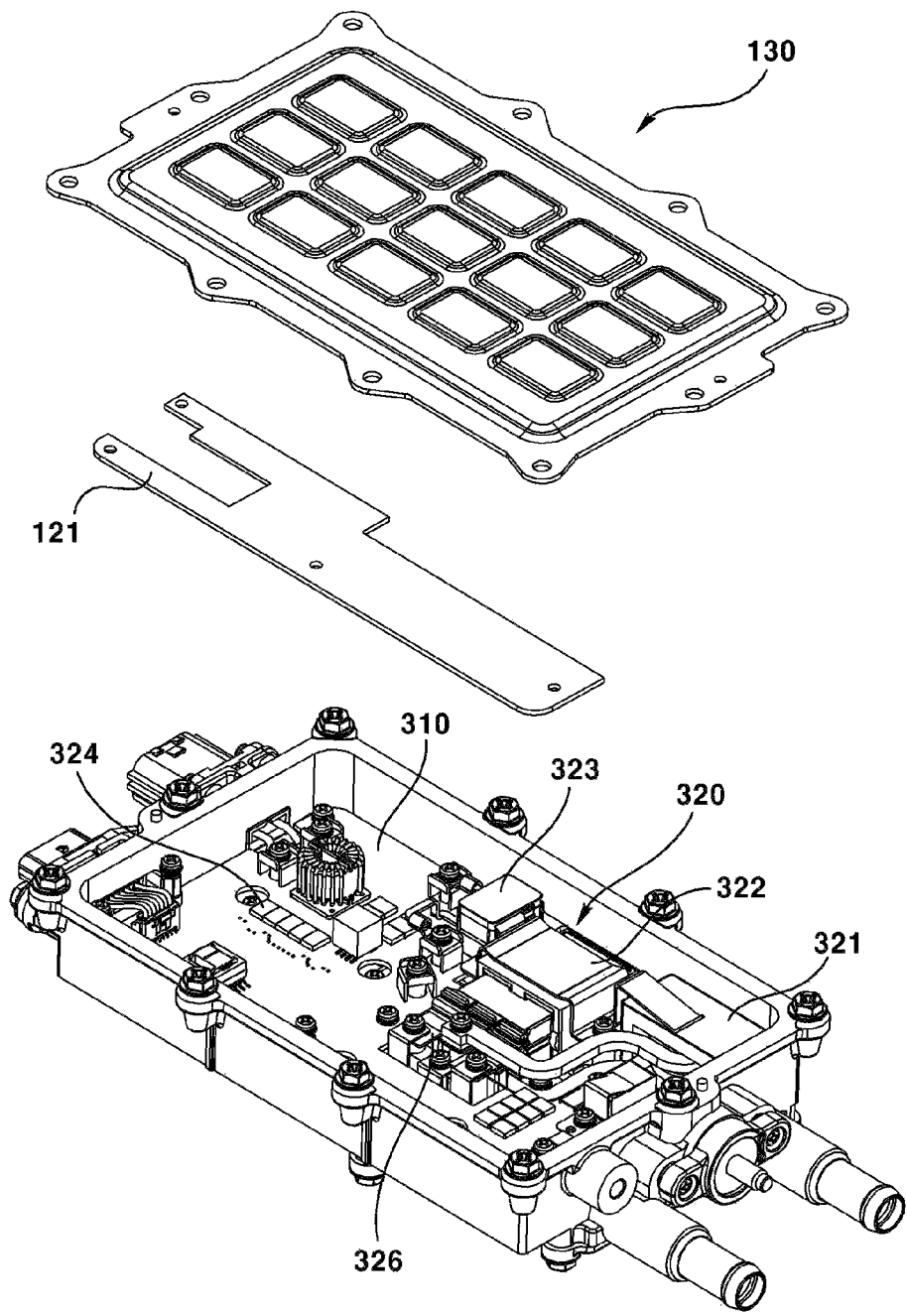
FIG. 3 is a perspective view of the DC-DC converter of the first embodiment wherein the upper cover and the protective plate are disassembled.
Figure 4:
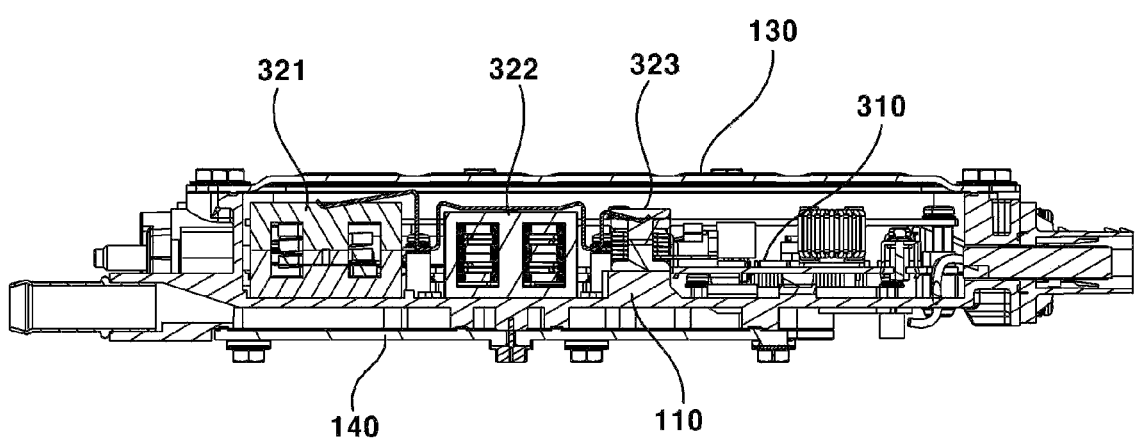
FIG. 4 is a cross sectional view of the DC-DC converter of the first embodiment with reference to line A-A'.
Figure 5:
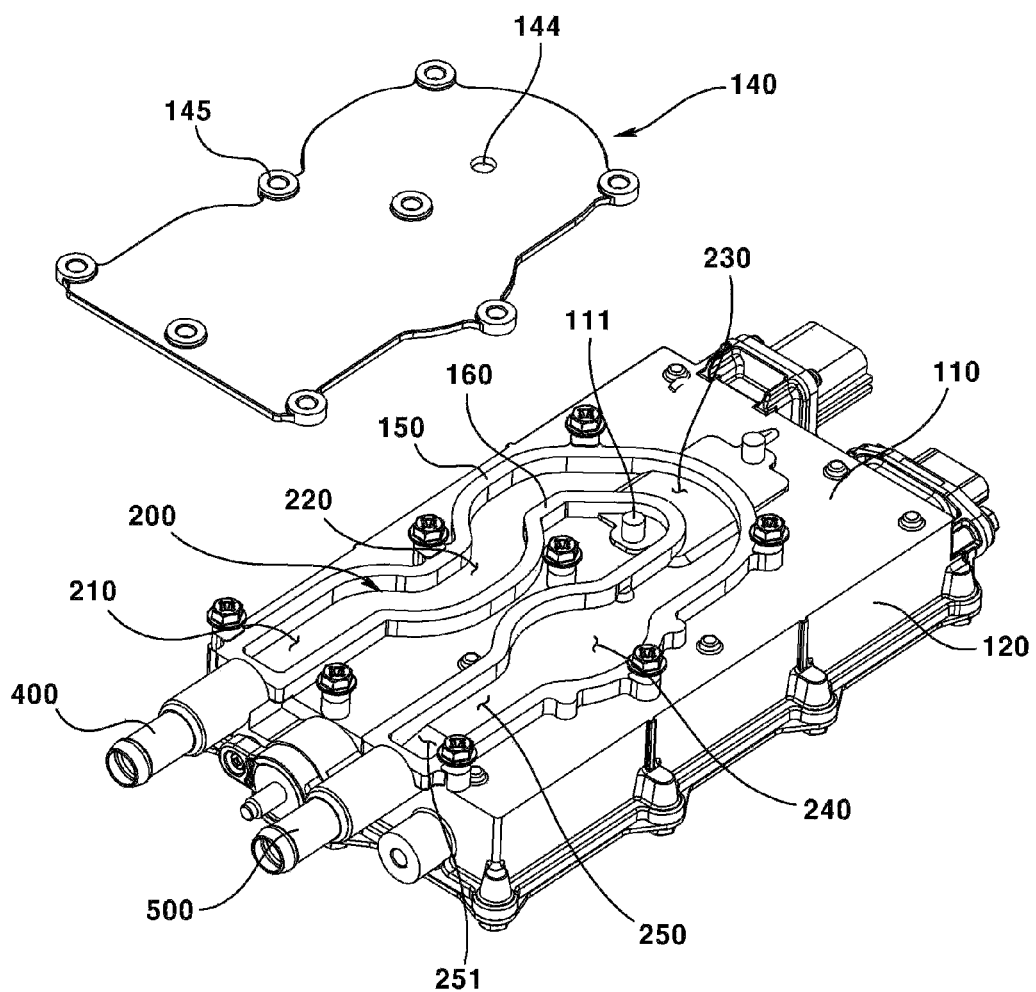
FIG. 5 is a perspective view of the DC-DC converter of the first embodiment with the lower cover removed and viewed from below.
Figure 6:
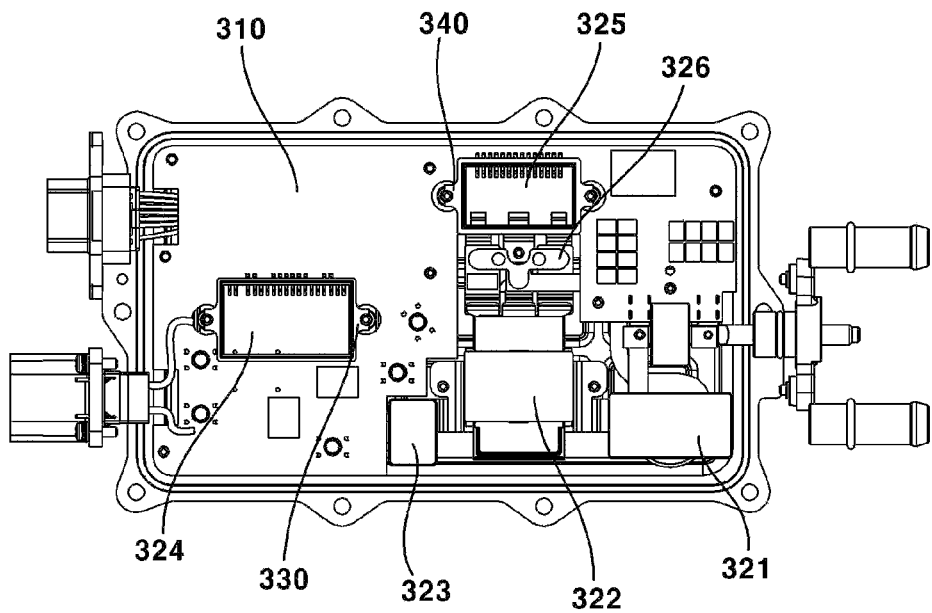
FIG. 6 is a plan view of the DC-DC converter of the first embodiment with the lower plate removed.
Figure 7:
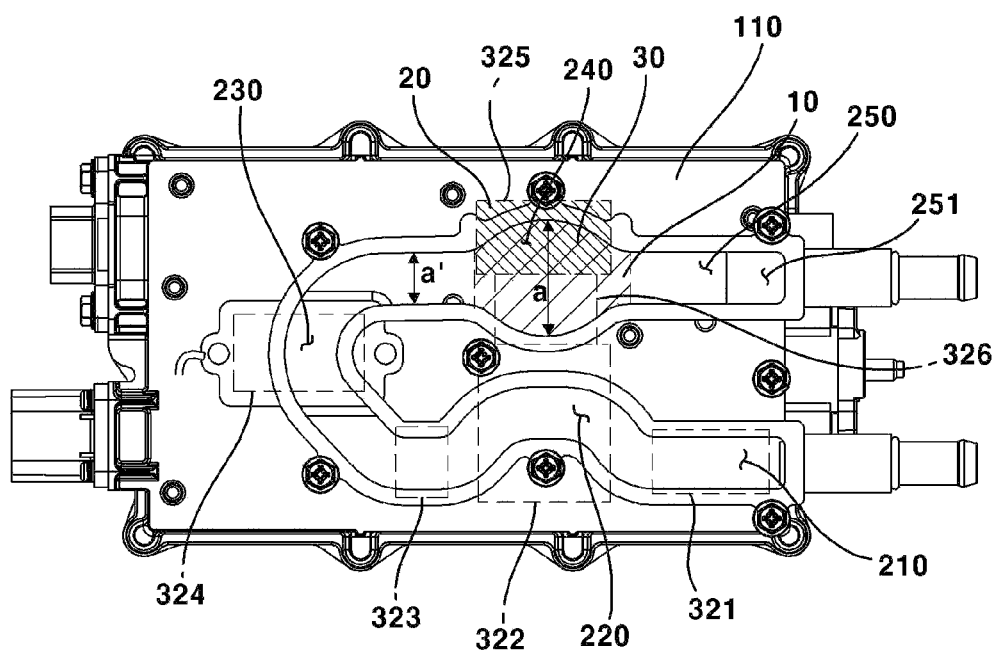
FIG. 7 is a plan view of the DC-DC converter of the first embodiment with the lower cover removed.
Figure 8:
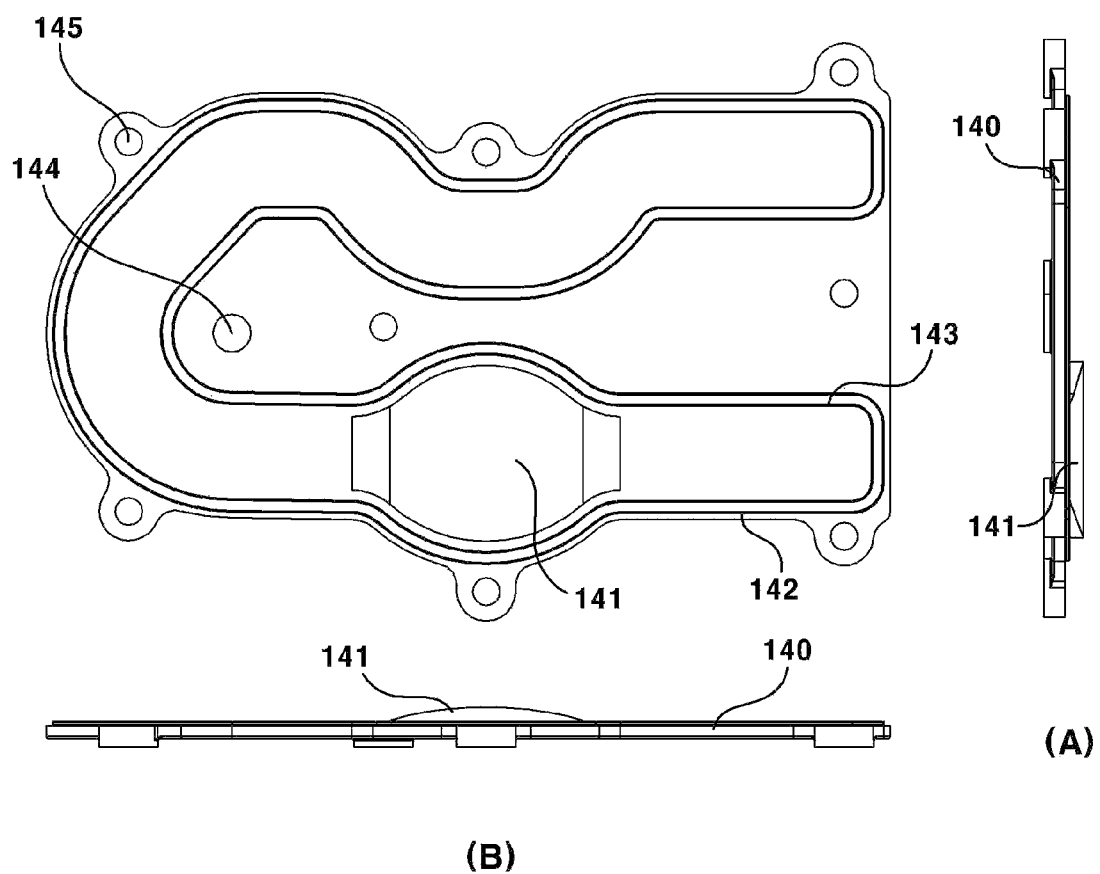
FIG. 8 is a plan view and a side view illustrating the lower cover of the first embodiment.
Figure 9A:
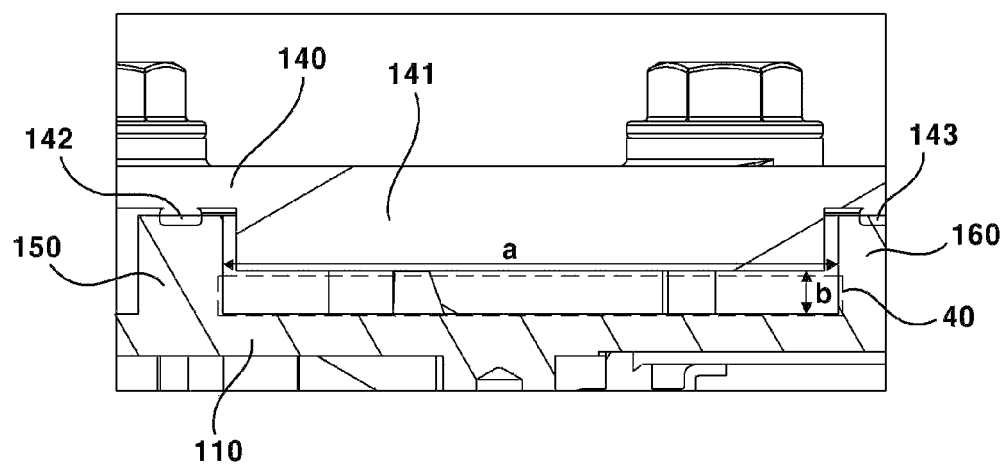
FIG. 9(a) illustrates the "vertical cross section" of the expanding portion.
Figure 9B:
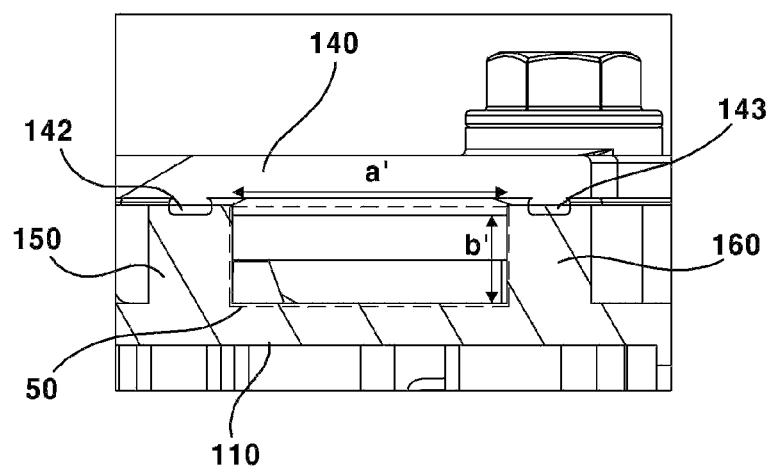
FIG. 9(b) illustrates the "vertical cross section" of the other part of the flow path respectively of the first embodiment.

Hereinafter, a DC-DC converter 1 of the first embodiment will be described with reference to the drawings. FIG. 1 is a perspective view of a DC-DC converter of the first embodiment viewed from above; FIG. 2 is a perspective view of the DC-DC converter of the first embodiment wherein the upper cover is disassembled; FIG. 3 is a perspective view of the DC-DC converter of the first embodiment wherein the upper cover and the protective plate are disassembled; FIG. 4 is a cross sectional view of the DC-DC converter of the first embodiment with reference to line A-A'; FIG. 5 is a perspective view of the DC-DC converter of the first embodiment with the lower cover removed and viewed from below; FIG. 6 is a plan view of the DC-DC converter of the first embodiment with the lower plate removed; FIG. 7 is a plan view of the DC-DC converter of the first embodiment with the lower cover removed; FIG. 8 is a plan view and a side view illustrating the lower cover of the first embodiment; and FIG. 9(*a*) illustrates the "vertical cross section" of the expanding portion, and FIG. 9(*b*) illustrates the "vertical cross section" of the other part of the flow path respectively of the first embodiment.

DC-DC converter 1000 can be used in a vehicle. For example, the DC-DC converter 1000 may play the role of receiving an electric current from an external power supply device (such as a lithium ion battery), boosting or lowering a voltage, supplying the voltage to an external electronic device (such as a motor), and thereby controlling the number of revolutions of a motor and the like.

The DC-DC converter 1000 may comprise a housing 100, a flow path 200, a plurality of electronic components 300, an inlet 400, an outlet 500, a terminal 600, and at least one connector 700.

The housing 100 may be an exterior member of the DC-DC converter 1000. The flow path 200 may be formed in the housing 100. A plurality of electronic components 300 can be accommodated in the housing 100. The plurality of electronic components 300 may be disposed inside the lower plate 110 of the housing 100 and the flow path 200 may be located below the lower plate 110. The plurality of electronic components 300 can be cooled by the cooling material flowing along the flow path 200. The housing 100 may be connected to an inlet 400, an outlet 500, a terminal 600, and at least one connector 700. The material of the housing 100 may comprise a plastic material and/or a metal material.

The housing 100 may comprise a lower plate 110, a side plate 120, a protective plate 121, an upper cover 130, a lower cover 140, a first sidewall 150, and a second sidewall 160.

The lower plate 110 may form a lower surface of the inner space of the housing 100. The lower plate 110 may be roughly in the form of a rectangular plate. The side plate 120 may form a side surface of the inner space of the housing 100. The side plate 120 may extend upward from the edge of the lower plate 110. The housing 100 may be provided with an inner space having an upper surface defined by the lower plate 110 and the side plate 120 is open. The plurality of electronic components 300 can be accommodated in the inner space of the housing 100.

The inlet 400, the outlet 500, and the terminal 600 may be located at one side of the side plate 120. At least one connector 700 may be located on the other side of the side plate 120. In this case, the inlet 400, the outlet 500 and the terminal 600 may be located on the opposite side of the at least one connector 700.

The protective plate 121 may be located in the inner space of the housing 100. The protective plate 121 may be disposed upwardly spaced apart from a main board 310. The protective plate 121 may overlap with at least a portion of the main board 310 in the vertical direction. That is, a portion of the upper surface of the main board 310 may be covered by the protective plate 121. The protective plate 121 may be a cover member for protecting a specific portion of the main board 310.

The upper cover 130 may be disposed above the side plate 120. The upper cover 130 and the side plate 120 can be combined by screws. The upper cover 130 may be roughly in the form of a rectangular plate. The inner space of the housing 100 can be closed by the upper cover 130 of the upper cover 130. The upper cover 130 may comprise a pattern portion 131 upwardly convexly protruding in a grid pattern at the center. The pattern unit 131 may function to protect the plurality of electronic components 300 accommodated in the inner space of the housing 100 by increasing the strength of the upper cover 130.

The upper cover 130 may comprise a flange portion 132 protruding in the horizontal direction at an edge thereof. The flange portion 132 having the form of a plate may be formed with a hole into which a screw is inserted.

The flow path 200 may be formed in the lower plate 110. The flow path 200 may be positioned on the lower surface of the lower plate 110. The first sidewall 150 and the second sidewall 160 may be horizontally spaced apart from each other and may be downwardly extended from the lower surface of the lower plate 110. The first sidewall 150 and the second sidewall 160 may be connected to each other at a point where the flow path 200 is connected to the inlet 400 and the outlet 500. The flow path 200 having an open lower surface defined by the lower plate 110, the first sidewall 150, and the second sidewall 160 may be formed. The lower cover 140 may be located below the first sidewall 150 and the second sidewall 160 to close the open surface.

That is, the flow path 200 can be formed by the lower surface of the lower plate 110, the inner surface of the first sidewall 150, the inner surface of the second sidewall 160, and the upper surface of the lower cover 140. In this case, the ceiling surface of the flow path 200 can be positioned on the lower surface of the lower plate 110, and both side surfaces of the flow path 200 are formed on the inner surface of the first sidewall 150 and the inner surface of the second sidewall 160, and the lower surface of the flow path 200 may be positioned on the upper surface of the lower cover 140.

The horizontal widths a and a' of the flow path 200 may be the shortest distance in the horizontal direction between the inner surface of the first sidewall 150 and the inner surface of the second sidewall 160. The vertical widths b and b' of the flow path 200 may be the shortest distance in the "vertical direction" between the lower surface of the lower plate 110 and the upper surface of the lower cover 140. The vertical widths a and a' of the flow path 200 and the horizontal widths b and b' of the flow path 200 may be the vertical side and the horizontal side of the "vertical cross section 40, 50."

The cooling material flowing in the flow path 200 can absorb heat radiated from the plurality of electronic components 300. In this case, heat transfer occurs through the lower plate 110, and the plurality of the electronic components 300 can be cooled.

The lower cover 140 may be in the form of a plate. The lower cover 140 may be positioned downwardly spaced apart from the lower plate 110. The upper surface of the lower cover 140 and the lower surface of the lower plate 110 may be connected by the first sidewall 150 and the second sidewall 160. The lower cover 140 may comprise a protruding part 141 projecting from the upper surface to the upper side (the direction in which the lower plate of the housing is located). The protruding part 141 may be positioned corresponding to the vertical direction of the expanding portion 240 of the flow path 200. The horizontal width a becomes larger on the "vertical cross section 40" of the expanding portion 240, but the vertical width b can be reduced. Therefore, the area of the "vertical cross section 50" can be maintained constant (within 10%, See FIG. 9) at the front end (upstream side) of the expanding portion 240, the expanding portion 240, and the rear end (downstream side). As a result, degradation of the cooling efficiency due to the large pressure difference of the cooling material and slowing down of the flow velocity can be prevented.

The lower cover 140 may be in the form of a plate. The lower cover 140 may comprise a first sealing portion 142 and a second sealing portion 143. The material of the first sealing portion 142 and the second sealing portion 143 may comprise a sealing material such as rubber. The first sealing portion 142 and the second sealing portion 143 may downwardly protruded from the lower surface of the lower cover 140. The first sealing portion 142 and the second sealing portion 143 may be spaced apart from each other in the "horizontal direction" (horizontal direction of the flow path).

The first sealing portion 142 may overlap the first sidewall 150 in a "vertical direction." The first sealing portion 142 can be in contact with the lower surface of the first sidewall 150. The first sealing portion 142 may have a shape corresponding to the first sidewall 150.

The second sealing portion 143 may overlap the second sidewall 160 in a "vertical direction." The second sealing portion 143 may be in contact with the lower surface of the second sidewall 160. The second sealing portion 143 may have a shape corresponding to the second sidewall 160.

The first sealing portion 142 may perform the function of closing the gap between the lower cover 140 and the first sidewall 150, and the second sealing portion 143 may perform the function of closing the gap between the lower cover 140 and the second sidewall 150.

The first sealing portion 142 and the second sealing portion 143 may be connected to each other at a position where the flow path 200 is connected to the inlet 400 and the outlet 500 in the same manner as the first sidewall 150 and the second sidewall 160.

The lower cover 140 may be combined to the first sidewall 150 and the second sidewall 160 with screws. The lower cover 140 may comprise a guide hole 144. A guide protrusion 111 downwardly protruding from the lower plate 110 is inserted into the guide hole 144 to guide the lower cover 140. The lower cover 140 may comprise a flange portion 145. The flange portion 145 of the lower cover 140 may be formed with a hole into which the screw is inserted.

The flow path 200 may be formed in the housing 100. The flow path 200 may be located at one side of the housing 100. The flow path 200 may be positioned below the lower plate 110 of the housing 100. Therefore, the lower plate 110 of the housing 100 may be a "cooling plate." The flow path 200 may be connected to the inlet 400. The flow path 200 may be connected to the outlet 500. The most upstream of the flow path 200 may be connected to the inlet 400 to be supplied with the cooling material. The downstream end of the flow path 200 may be connected to the outlet 500 to discharge the cooling material. The cooling material flows along the flow path 200 and can cool the heat generated by the plurality of electronic components 300. Various types of heat exchange fluids (e.g., cooling water) may be used as cooling materials.

The flow path 200 may be formed by a lower plate 110, a first sidewall 150, a second sidewall 160, and a lower cover 140. The bottom surface of the flow path 200 may be positioned on the upper surface of the lower cover 140. That is, the upper surface of the lower cover 140 may be the bottom surface of the flow path 200. The ceiling of the flow path 200 may be positioned on the lower surface of the lower plate 110. That is, the lower surface of the lower plate 110 may be a ceiling surface of the flow path 200. Both side surfaces of the flow path 200 may be located on the inner surfaces of the first sidewall 150 and the second sidewall 160, respectively. That is, the inner side surfaces of the first sidewall 150 and the second sidewall 160 could be both sides of the flow path 200.

The horizontal widths a and a' of the flow path 200 may be defined by the shortest distance in the "horizontal direction" between the inner surface of the first sidewall 150 and the inner surface of the second sidewall 160. The vertical widths b and b' of the flow path 200 may be defined by the shortest distance in the "vertical direction" between the lower surface of the lower plate 110 and the upper surface of the lower cover 140. The horizontal widths b and b' of the flow path 200 and the vertical widths a and a' of the flow path 200 may be different depending on the moving direction of the cooling material.

For example, in the expanding portion 240, the horizontal width a of the flow path 200 may be greater than the horizontal width a' of the front end (upstream side of the expanding portion) or the rear end (downstream side of the expanding portion) of the expanding portion 240. Also, in the expanding portion 240, the vertical width b of the flow path 200 may be smaller than the vertical width b' of the front end (upstream side of the expanding portion) or the rear end (downstream side of the expanding portion) of the expanding portion 240.

The flow path 200 may comprise an inlet portion 210, a first curved portion 220, a second curved portion 230, an expanding portion 240, and an outlet portion 250. The upstream of the inlet 210 may be connected to the inlet 400. The downstream portion of the outlet portion 250 may be connected to the outlet 500. The downstream of the inlet portion 210 can be connected to the upstream of the first curved portion 220; the downstream of the first curved portion 220 can be connected to the upstream of the second curved portion 230; the downstream of the second curved portion 230 may be connected to the upstream of the expanding portion 240; and the downstream of the expanding portion 240 may be connected to the upstream of the outlet portion 250. Accordingly, the cooling material introduced from the inlet 400 sequentially moves through the inlet portion 210, the first curved portion 220, the second curved portion 230, the expanding portion 240, and the outlet portion 250, and then can be discharged through the outlet 500.

The inlet portion 210 and the outlet portion 250 may be disposed adjacent to each other. The inlet portion 210 and the outlet portion 250 may be disposed in parallel with each other. The inlet portion 210 and the outlet portion 250 may be spaced apart in the "horizontal direction" (horizontal width direction of the flow path). The first curved portion 220 and the expanding portion 240 may be disposed adjacent to each other. The first curved portion 220 and the expanding portion 240 can be spaced apart in the "horizontal direction" (horizontal width direction of the flow path). The second curved portion 230 may be a point at which the flow direction of the cooling water in the flow path 200 is completely inverted (turn-up or U-turn). The second curved portion 230 may be formed in the shape of a letter "U." One end of the second curved portion 230 may be connected to the first curved portion 220. The other end of the second curved portion 230 may be connected to the expanding portion 240. The second curved portion 230 may connect the first curved portion 220 and the expanding portion 240. The direction of movement of the cooling material in the inlet portion 210 and the outlet portion 250 disposed in parallel may be reversed by the second curved portion 230.

The first curved portion 220 may have a convex curvature in a direction in which the expanding portion 240 is located. The shortest "horizontal direction" distance between the first curved portion 220 and the expanding portion 240 may be less than the shortest "horizontal direction" distance between the inlet portion 210 and the outlet portion 250. The curvature of the second curved portion 230 may be convex (U-shaped) in a direction opposite to the direction in which the inlet portion 210 and the outlet portion 250 are located. The expanding portion 240 may be convexly curved in the "horizontal direction." The width a of the flow path 200 in the expanding portion 240 may be greater than the width a' of another portion of the flow path 200 (for example, the front end or the rear end of the expanding portion 240).

In the first embodiment, the inlet portion 210, the first curved portion 220, the second curved portion 230, the expanding portion 240, and the outlet portion 250 are formed in the flow path 200, so as to effectively cool the heating element 320.

Each of the plurality of heating elements 320 comprises an inductor 321, a transformer 322, a Zero-Voltage-Switching (ZVS) inductor 323, a switching module 324, a diode module 325, and the like, wherein the inlet portion 210 may be disposed to correspond to the inductor 210 in the vertical direction (horizontal direction of the flow path); the first curved portion 220 may be disposed so as to be vertically corresponding to the transformer 220; the front end (the upstream side of the second curved portion) of the second curved portion 230 may be disposed so as to be vertically aligned with the ZVS inductor 323; the second curved portion 230 may be disposed so as to be vertically corresponding to the switching module 324; and the expanding portion 240 may be disposed so as to be vertically corresponding to the diode module 240 in the vertical direction (see FIG. 7).

In this case, the curvature of the first curved portion 220 is convexly formed in a direction in which the expanding portion 240 is located so as to efficiently cool the transformer 322 having a larger "horizontal area" than the inductor 321 (to cool the center portion of the transformer).

In addition, the expanding portion 240 has a larger "horizontal area" than the other portions of the flow path 200 in order to efficiently cool the diode module 325 having a high heating value. The expanding portion 240 can be disposed between the transformer 322 and the diode module 325 as well as the diode module 325 due to its wide "horizontal area," so that a conducting member 326 which electrically connects the two together can also be cooled. To this end, the maximum "horizontal area" 10, the largest area of the horizontal area of the expanding portion, of the expanding portion 240 may be more than 90% of the maximum "horizontal area" 20, the largest area of the horizontal area of the diode module, of the diode module 325. Also, the area 30 that overlaps the diode module 325 in the "vertical direction" at the maximum "horizontal area" 10 of the expanding portion 240 may be more than 30%.

On the other hand, the flow path 200 of the first embodiment is characterized in that the "vertical cross section" 50 is uniform along the moving direction of the cooling material. The difference between the largest portion and the smallest portion of the area of the "vertical cross section" 50 of the flow path 200 may be within 10% or less. The area of the "vertical cross section" 50 of the flow path 200 may be the same along the moving direction of the cooling material. As a result, the flow rate of the cooling material can be increased and the pressure drop width can be reduced, thereby improving the cooling efficiency.

The width a of the flow path 200 may be widened in the expanding portion 240, so that the diode module 325 can be efficiently cooled. As a result, the area of the "vertical cross section" 40 in the expanding portion 240 can be larger than the area of the "vertical cross section" 50 of the other portion of the flow path 200. This may be contradict to the intention of the first embodiment to make the "vertical cross section" 50 of the flow path 200 be uniform.

In order to solve this problem, in the first embodiment, the vertical width b of the "vertical cross section" 40 in the expanding section 240 is set to be smaller than the vertical width b' of the "vertical cross section" 50 of the other portion (for example, the front end of the expanding portion) of the flow path 200. As a result, the area of the "vertical cross section" 40 of the expanding portion 240 may be the same as or similar to the area of the "vertical cross section" 50 (Refer to FIG. 9).

To this end, the protruding part 141 may be positioned on the bottom surface of the expanding portion 240. That is, the protruding part 141 may be positioned in the lower cover 140 at a position corresponding to the "vertical direction" with respect to the expanding portion 240. As a result, the vertical width b of the expanding portion 240 can be widened while maintaining the height of the first sidewall 150 and the second sidewall 160.

The protruding part 141 may be protruded from the bottom surface of the expanding portion 240 in a direction in which the lower plate 110 is positioned. The protruding height of the protruding part 141 may increase and then decrease along the moving direction of the cooling material. The "vertical cross section" of the protruding part 141 may have the shape of a rectangle (see FIG. 8 (A)). The area of the "vertical cross section" of the protruding part 141 may increase and then decrease along the moving direction of the cooling material. The "horizontal cross section" of the protruding part 141 may be a shape in which the curvature is convexly formed towards the lower plate 110 is located (see FIG. 8 (B)). The area of the "horizontal cross section" of the protruding part 141 can be reduced as it travels from the center of the horizontal width a of the expanding portion 240 toward the edge.

The outlet portion 250 may comprise a curved portion 251. The curved portion 251 may be positioned between the outlet portion 250 and the outlet 500. The curved portion 251 may be located at the end of downstream of the outlet portion 250. In the curved portion 251, the bottom surface of the flow path 200 may be upwardly inclined as it travels towards the downstream side.

The plurality of electronic components 300 may be located in the inner space of the housing 100. The plurality of electronic components 300 may be disposed above the lower plate 110 (cooling plate). Below the lower plate 110 (cooling plate), a flow path 200 through which the cooling material flows may be formed so that the heat generated by the plurality of electronic components 300 can be cooled.

The plurality of electronic components 300 may comprise a main board 310, a plurality of heating elements 320, a first auxiliary board 330, and a second auxiliary board 340.

The main board 320 may be disposed above the lower plate 110. The main board 320 may be upwardly spaced apart from the upper plate 110. Various electronic component chips may be mounted on the main board 320. A circuit for interconnecting various electronic component chips may be formed on the main board 320. The main board 320 may be electrically connected to the first auxiliary board 330 and the second auxiliary board 340.

One of the plurality of heating elements 320 may overlap with the expanding portion 240 in a "vertical direction." The maximum "horizontal area" 10 of the expanding portion 240 may be at least 90% of the maximum "horizontal area" 20 of one of the plurality of heating elements 320 overlapping in the "vertical direction." The area 30 overlapping with one of the plurality of heating elements 320 overlapping in the "vertical direction" at the maximum "horizontal area" 10 of the expanding portion 240 may be more than 30%. In this case, among the plurality of heating elements 320, the heating element overlapping in the "vertical direction" with the expanding portion 240 may be the diode module 325.

Each of the plurality of heating elements 320 may comprise an inductor 321, a transformer 322, a zero-voltage-switching (ZVS) inductor 323, a switching module 324, a diode module 325, and a conducting member 326.

The inductor 321, the transformer 322 and the zero-voltage-switching (ZVS) inductor 323 may be disposed on the upper surface of the lower plate 110. The switching module 324 may be mounted on the first auxiliary board 330. The diode module 325 may be mounted on the second auxiliary board 340. The conducting member 326 may be a member that electrically connects the transformer 322 and the diode module 325.

The inductor 321, the transformer 322 and the zero-voltage-switching (ZVS) inductor 323 may be electrically connected to the main board 320 by a conducting member. The main board 320 may not be disposed in a portion where the inductor 321, the transformer 322 and the zero-voltage-switching (ZVS) inductor 323 are disposed in the lower plate 110.

The inductor 321 can perform the function of smoothing the current and reducing the ripple current. Further, the current flow can be made continuous. That is, the inductor 321 may perform the function of rectifying current. The inductors 321 may be disposed so as to correspond to the inlet portion 210 of the flow path 200 in a "vertical direction."

The transformer 322 can perform the function of boosting or reducing current. The transformer 322 can perform a function of converting power. The transformer 322 may be disposed to correspond to the first curved portion 220 of the flow path 200 in a "vertical direction."

The zero-voltage-switching (ZVS) inductor 323 can control a light load. That is, it may be an auxiliary inductor for improving light load efficiency. The zero-voltage-switching (ZVS) inductor 323 may be disposed in a "vertical direction" corresponding to the front end of the second curved portion 230.

The switching module 324 can control ON/OFF of the current. Further, the switching module 324 can be integrated with the transformer 322 to lower the DC input voltage and output it. The switching module 324 may be disposed to correspond to the second curved portion 230 in the "vertical direction."

The diode module 325 can control the direction of the current. That is, the diode module 325 can perform the function of moving the current in a specific direction. The diode module 325 may be disposed corresponding to a "vertical direction" with respect to the expanding portion 240.

The conducting member 326 can electrically connect the transformer 322 and the diode module 325.

The first auxiliary board 330 and the second auxiliary board 340 may be positioned below the main board 310. The first auxiliary board 330 and the second auxiliary board 340 may be downwardly spaced apart from the main board 310. The first auxiliary board 330 and the second auxiliary board 340 may be disposed between the lower plate 110 and the main board 310. The first auxiliary board 330 and the second auxiliary board 340 may be electrically connected to the main board 310 by a separate conducting member. The switching module 324 may be mounted on the first auxiliary board 330. The diode module 325 may be mounted on the second auxiliary board 340.

The inlet 400 and the outlet 500 may be located at one side of the side plate 120 of the housing 100. The external cooling material may flow into the flow path 200 through the inlet 400. The cooling material may be discharged from the flow path 200 through the outlet 500.

The terminal 600 may be located at one side of the side plate 120 of the housing 100. The terminal 600 may be located between the inlet 400 and the outlet 500. An external power supply may be electrically connected to the terminal 600. That is, an external current may be supplied to the plurality of electronic components 300 through the terminal 600.

At least one connector 700 may be located on the other side of the side plate 120 of the housing 100. The at least one connector 700 may be located on the opposite side of the inlet 400 and the outlet 500. The at least one connector 700 may be electrically connected to an external electronic component (for example, an electric motor).

Second Embodiment

Figure 10:
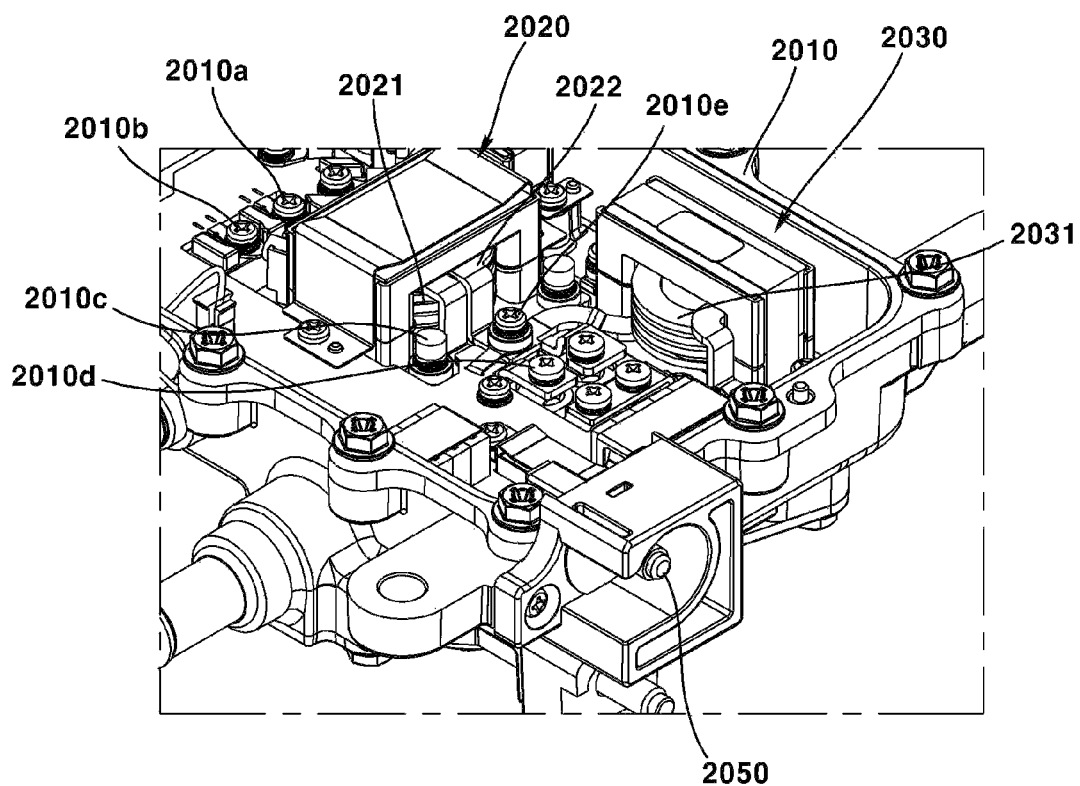
FIG. 10 is a perspective view illustrating a DC-DC converter of a comparative example of the second embodiment.

Hereinafter, a DC-DC converter 2001 according to a comparative example of the present second embodiment will be described with reference to the drawings. FIG. 10 is a perspective view illustrating a DC-DC converter of a comparative example of the second embodiment.

The DC-DC converter 2001 of the present comparative embodiment may be a DC-DC converter used in a vehicle. For example, the DC-DC converter 1000 may play the role of receiving an electric current from an external power supply device (such as a lithium ion battery), boosting or lowering a voltage, supplying the voltage to an external electronic device (such as a motor), and thereby controlling the number of revolutions of a motor and the like. The DC-DC converter 2001 may comprise a case 2010, a conversion unit 2020, an inductor unit 2030, a bus bar (not shown), and an external terminal 2050.

The case 2010 may be an external member of the DC-DC converter 2001. In the case 2001, an internal space is formed to accommodate the conversion unit 2020, the inductor unit 2030, and a bus bar (not shown). The case 2010 may be formed with a first, a second, a third, a fourth, and a fifth case terminals 2010a, 2010b, 2010c, 2010d, and 2010e, and an external terminal 2050.

The conversion unit 2020 may comprise a primary coil 2021 and a secondary coil 2022 disposed apart from the primary coil 2021. A current supplied from an external power supply device flows through the primary coil 2021, and the secondary coil 2022 may interact electromagnetically with the primary coil 2021 to output the converted current. The primary coil 2021 may be electrically connected to the first and the second case terminals 2010a and 2010b and may be supplied with a current from an external power supply device. The secondary coil 2022 may be electrically connected to the third, the fourth, and the fifth case terminals 2010c, 2010d, and 2010e. In this case, the third case terminal 2010c and the fourth case terminal 2010d may be electrically connected to the diode module. Accordingly, the secondary coil 2022 can be electrically connected to the diode module. In addition, the fifth case terminal 2010e may be electrically connected to the inductor unit 2030.

The inductor unit 2030 may comprise an inductor coil 2031. The inductor coil 2031 may be in the form of a three-dimensional spiral. These three-dimensional spirals are sometimes referred to as "screw spirals." The initial portion of the inductor coil 2031 may be electrically connected to the fifth case terminal 2010e. The initial portion of the inductor coil 2031 may be electrically connected to the secondary coil 2022 at the fifth case terminal 2010e. The end of the inductor coil 2031 may be electrically connected to the external terminal 2050 through a bus bar (not shown). The inductor coil 2031 can be supplied with the converted current output from the secondary coil 2022. Further, the inductor coil 2031 can rectify the converted current output from the secondary coil 2022. Further, the current rectified by the inductor coil 2031 can be supplied to the external terminal 2050.

By summarizing the above description, when the current is supplied from the external power device to the primary coil 2021, the secondary coil 2022 can output the boosted or lowered converted current. The converted current output from the secondary coil 2022 can be rectified in the inductor coil 2031. The rectified current may be supplied to an external electronic device (for example, a motor) through the external terminal 2050. In this case, the secondary coil 2022 may be electrically connected to one side of the external terminal 2050 through the third case terminal 2010c. The secondary coil 2022 may be electrically connected to the other end of the external terminal 2050 through the fifth case terminal 2010e, the inductor coil 2031, and the bus bar 2040. Accordingly, a circuit may be formed wherein a current generated in the secondary coil 2022 is rectified in the inductor coil 2031 and being supplied to the external electronic device. As a result, the external electronic device connected to the external terminal 2050 can be supplied with a current that is converted in the secondary coil 2022 and rectified in the inductor coil 2031.

In the present comparative embodiment of the second embodiment, the secondary coil 2022, the inductor coil 2031, and the bus bar (not shown) are electrically connected to each other, however, each of them is separately manufactured as a single member. Thereafter, the secondary coil 2022 and the inductor coil 2031 are bolt-coupled together at the fifth case terminal 2010e so that they may be electrically connected. In addition, the inductor coil 2031 and the bus bar (not shown) may also be bolt-coupled together so that they may be electrically connected. A gap may be generated in this bonding process, which leads not only to deterioration of electrical characteristics but also to an increase in contact resistance, thereby lowering the conversion efficiency of the DC-DC converter 2001. In order to manufacture each of the secondary coil 2022 and the inductor coil 2031, complicated manufacturing processes such as sheet press cutting, bolt hole punching, bending, forging, and the like are required. As a result, there is a problem in the aspects of production efficiency.

Figure 11:
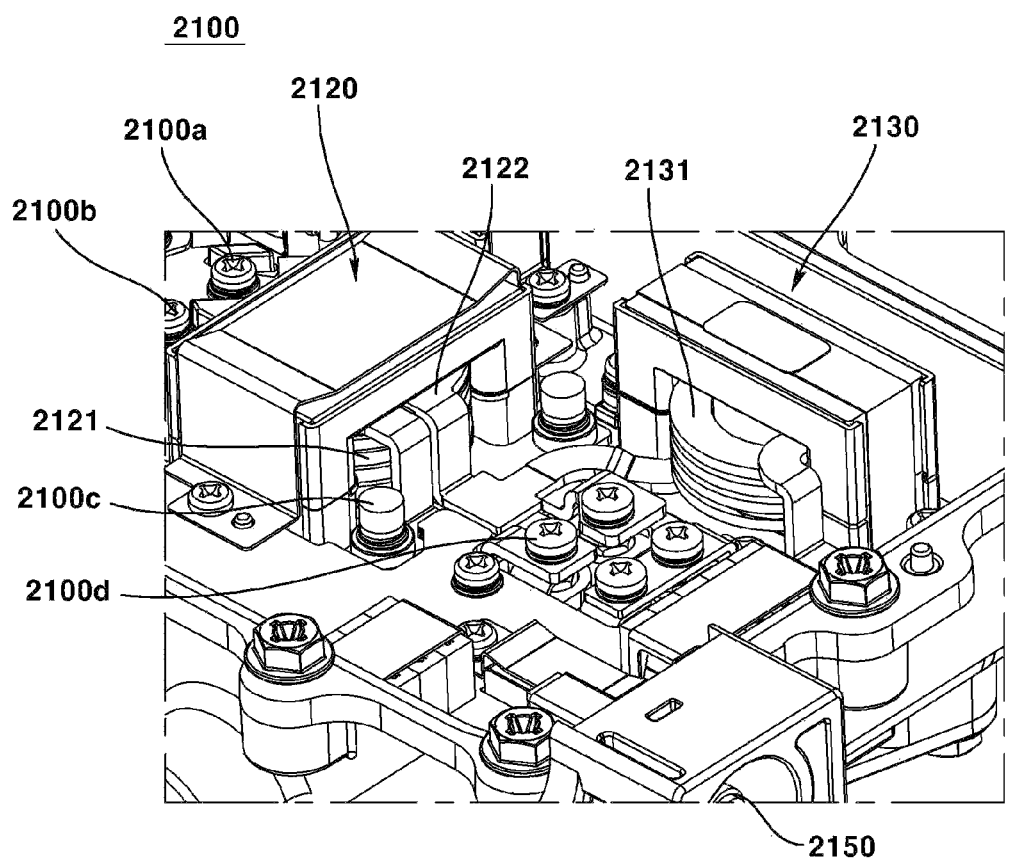
FIG. 11 is a perspective view illustrating the DC-DC converter of the second embodiment.
Figure 12:
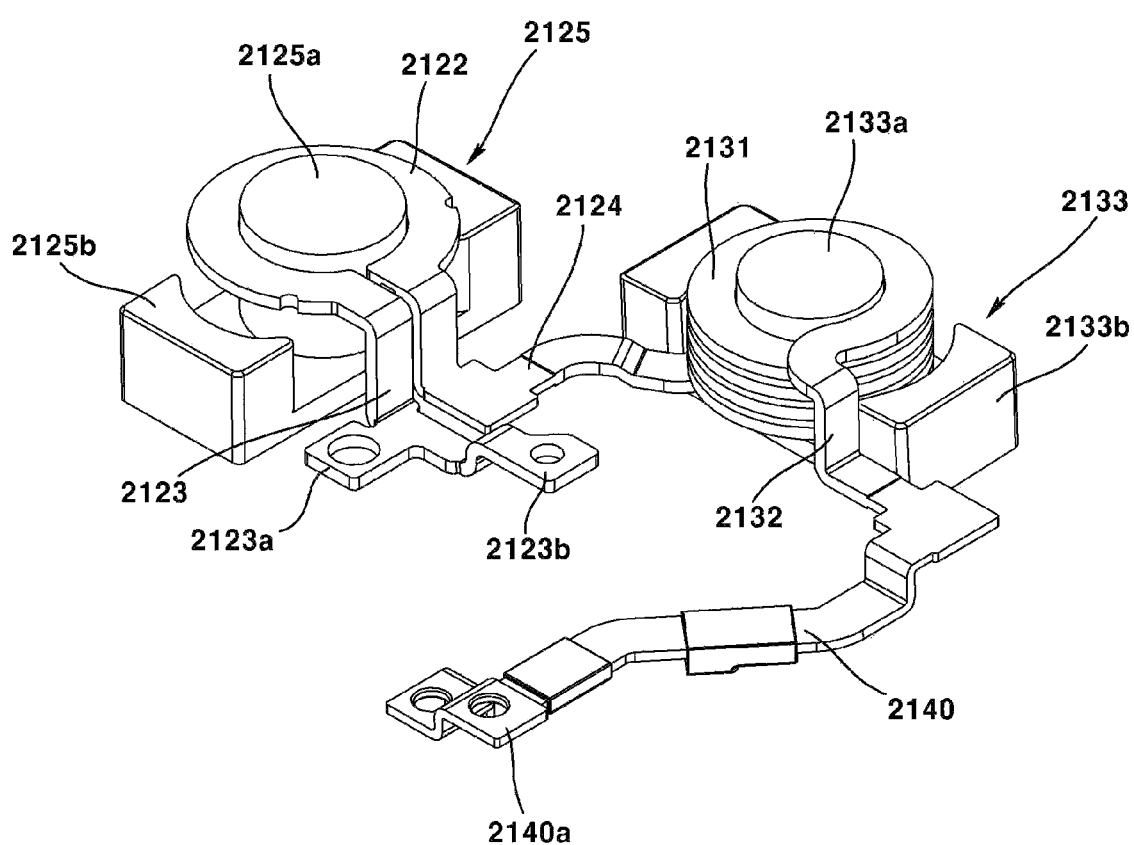
FIG. 12 is a perspective view illustrating a state in which the coil module of the second embodiment is mounted on the first magnetic core and the second magnetic core (the primary coil is omitted).
Figure 13:
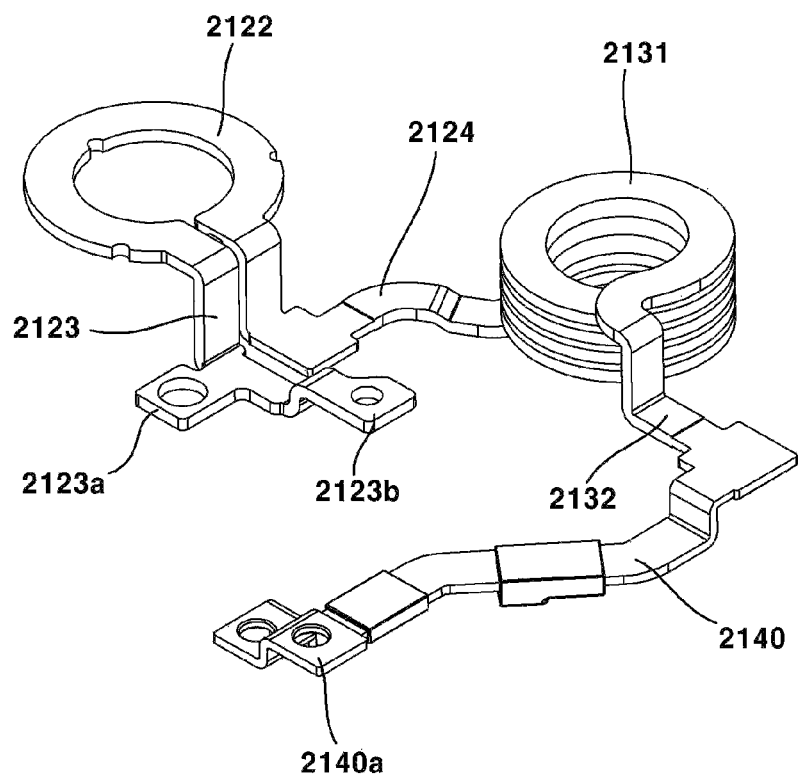
FIG. 13 is a perspective view illustrating the coil module of the second embodiment (the primary coil is omitted).

Hereinafter, the DC-DC converter 2100 of the present second embodiment will be described with reference to the drawings. FIG. 11 is a perspective view illustrating the DC-DC converter of the second embodiment; FIG. 12 is a perspective view illustrating a state in which the coil module of the second embodiment is mounted on the first magnetic core and the second magnetic core (the primary coil is omitted); and FIG. 13 is a perspective view illustrating the coil module of the second embodiment (the primary coil is omitted).

The DC-DC converter 2100 of the second embodiment may comprise a case 2110, a conversion unit 2120, an inductor unit 2130, a bus bar 2140, and a first external terminal 2150. Among these, the assembly of the secondary coil 2122 of the conversion unit 2120, the first and the second terminals 2123 and 2124 and the inductor coil 2131 of the inductor unit 2130, and the third terminal 2132 and the bus bar 2140 may be referred to as a "coil module." Among the "coil module," the first, the second, and the third terminals 2123, 2124, and 2132, and the bus bar 2140 are conducting members for electrical connection, and may be omitted by a request based on design aspects. The secondary coil 2122, the first and the second terminals 2123 and 2124, the inductor coil 2131, the third terminal 2132, and the bus bar 2140 may be integrally fabricated by casting. That is, among the "coil module," the secondary coil 2122, the first and the second terminals 2123 and 2124, the inductor coil 2131, the third terminal 2132, and the bus bar 2140 can be integrally formed.

By summarizing the above description, there may be a difference in that the DC-DC converter 2100 of the second embodiment has the secondary coil 2122, the inductor coil 2131, and the bus bar 2140 are integrally fabricated by "casting" when compared with the DC-DC converter 2010 of the comparative example. That is, the secondary coil 2122, the inductor coil 2131, and the bus bar 2140 may be integrally formed. Therefore, complicated processes such as sheet press cutting, bolt hole punching, bending, forging, and the like for manufacturing of the secondary coil 2122 and the inductor coil 2131 may be omitted. In addition, bolt-coupling for connecting the secondary coil 2122 and the inductor coil 2131 can be omitted. In addition, bolt-coupling for connecting the inductor coil 2131 and the bus bar 2140 can be omitted (as a result, the fifth case terminal 2010e of the comparative embodiment for bolt-coupling also can be omitted). In such an integral type coil module, since bolt-coupling is not necessary, there is no gap that can be occurred by bolt-coupling. As a result, the problem of the bolt-coupling described above does not occur, and the conversion efficiency of the DC-DC converter 2100 can be increased.

The case 2110 may be an exterior member of the DC-DC converter 2100. An internal space is formed in the case 2110 to accommodate the conversion unit 2120, the inductor unit 2130, and the bus bar 2140. A first, a second, and a third case terminals 2110a, 2110b, and 2110c and a first external terminal 2150 may be formed in the case 2110.

The conversion unit 2120 can be supplied with a current from an external power supply device. The conversion unit 2120 can convert an external current and output. The conversion unit 2120 may comprise a primary coil 2121, a secondary coil 2122, a first terminal 2123, a second terminal 2124, and a first magnetic core 2125.

The primary coil 2121 can be supplied with current from the external power supply device. The primary coil 2121 is in the form of a three-dimensional spiral, and the initial portion of the spiral growth can be electrically connected to the first case terminal 2100a by the conducting member. The end portion of the spiral growth of the primary coil 2121 may be electrically connected to the second case terminal 2100b by a conducting member. The first and the second case terminals 2100a and 2100b may be electrically connected to an external power supply device. As a result, a current supplied from the external power supply device can flow through the primary coil 2121. In the present embodiment, the primary coil 2121 is a three-dimensional spiral having curved lines. However, the shape of the spiral of the primary coil 2121 is not limited thereto.

The secondary coil 2122 may be a component of a "coil module." The secondary coil 2122 may be disposed apart from the primary coil 2121. The secondary coil 2122 may be disposed above the primary coil 2121. The secondary coil 2122 may electromagnetically interact with the primary coil 2121. In the secondary coil 2122, a current is induced by the current of the primary coil 2121, and an induced current can be generated. The induced current generated in the secondary coil 2122 may be a current that is boosted or lowered by the current flowing through the primary coil 2121.

The secondary coil 2122 may have the shape of an open ring-type plate comprising an upper surface and a lower surface. The initial portion (one end) of the secondary coil 2122 may be a shape extended from the first terminal 2123. The end portion (other end) of the secondary coil 2122 may be connected to the second terminal 2124. That is, one end of the secondary coil 2122 may be electrically connected to the first terminal 2123, and the other end of the secondary coil 2122 may be electrically connected to the second terminal 2124. The secondary coil 2122 and the first and the second terminals 2123 and 2124 may be integrally formed. However, the shape of the secondary coil 2122 is not limited to the ring-type as described above. For example, the secondary coil 2122 may be disposed in a three-dimensional spiral shape, spaced vertically or horizontally from the primary coil 2121. In addition, the secondary coil 2122 may be a three-dimensional spiral shape interleaving with the primary coil 2121 while being spaced apart from each other. In this case, the primary and the secondary coils 2121 and 2122 can be formed into one double-layered three-dimensional spiral.

The first terminal 2123 may be a component of the "coil module." The first terminal 2123 may be a member for electrically connecting the secondary coil 2122 to an external terminal. The first terminal 2123 may be a plate-shaped conducting member. The first terminal 2123 may be a shape extended from the above towards the lower side (vertical direction). One end of the first terminal 2123 may be located at the top. The other end of the first terminal 2123 may be located at the lower portion. One end of the first terminal 123 may be curved or bent and extended in the vertical direction at the initial portion of the secondary coil 2122. The other end of the first terminal 2123 may be curved or bent in the horizontal direction and then divided into a first and a second terminal portions 2123a and 2123b which will be described later. According to the above description, the first terminal 2123 may comprise at least one of a bent portion and a curved portion. In this case, the bent or curved angle of the bent portion or the curved portion may be right angled.

One end of the first terminal 2123 may be electrically connected to the initial portion of the secondary coil 2122. The other end of the first terminal 2123 can be divided into a first terminal portion 2123a and a second terminal portion 2123b. The first terminal portion 2123a may be electrically connected to the third case terminal 2100c by bolt-coupling. Therefore, a hole for bolt-coupling may be formed on the first terminal portion 2123a. And the second terminal portion 2123b may be electrically connected to the fourth case terminal 2110d by bolt-coupling. Therefore, a hole for bolt-coupling may be formed on the second terminal portion 2123b. The third case terminal 2110c and the fourth case terminal 2100c may be electrically connected to a diode module (not shown). Accordingly, the secondary coil 2122 can be electrically connected to the diode module through the first terminal 2123.

Second terminal 2124 may be a component of a "coil module." The second terminal 2124 may be extended from the secondary coil 2122. The second terminal 2124 may be a member for electrically connecting the secondary coil 2122 and the inductor coil 2131. The second terminal 2124 may be a plate-shaped conducting member. The second terminal 2124 may be a shape extended from the above towards the lower side (vertical direction) and then extended towards the inductor coil 2131 (horizontal direction). One end of the second terminal 2124 may be curved or bent and extended in the vertical direction at the end portion of the secondary coil 2122. The middle portion of the second terminal 2124 may be curved or bent and extended toward the inductor coil 2131 (horizontal direction). The other end of the second terminal 2124 may be connected to the initial portion of the inductor coil 2131. According to the above description, the second terminal 2124 may comprise at least one of a bent portion and a curved portion. In this case, the bent or curved angle of the bent portion or the curved portion may be right angled.

One end of the second terminal 2124 may be electrically connected to the end portion of the secondary coil 2122. The other end of the second terminal 2124 may be electrically connected to the initial portion of the inductor coil 2131. By summarizing the above description, the current generated in the secondary coil 2122 can be supplied to the inductor coil 2131 through the second terminal 2124.

A primary coil 2121 and a secondary coil 2122 may be disposed in the first magnetic core 2125. The first magnetic core 2125 may be a ferromagnetic member that collects magnetic flux lines of the primary coil 2121 and the secondary coil 2122 to increase the strength of the magnetic field. The first magnetic core 2125 may comprise a first bobbin portion 2125*a* and a first support portion 2125*b*. The first support portion 2125*b* is formed in the shape of a block having an inner space at the center thereof, and a first bobbin portion 2125*a* is formed in the inner space so that the primary coil 2121 may be supported. The primary coil 2121 and the secondary coil 2122 may be wound around the first bobbin portion 2125*a*. The outer surface of the first magnetic core 2125 may be coated with an insulating material. The first magnetic core 2125 may have various shapes according to the request based on the design aspects.

The inductor unit 2130 can rectify the current generated in the conversion unit 2120. The inductor unit 2130 may comprise an inductor coil 2131, a third terminal 2132, and a second magnetic core 2133.

The inductor coil 2131 may be a component of a "coil module." The inductor coil 2131 can be supplied with the converted current from the secondary coil 2122. The inductor coil 2131 can rectify the converted current. The inductor coil 2131 may be connected to the first external terminal 2150 to supply a rectified current.

The inductor coil 2131 may have a shape of a plate comprising an upper surface and a lower surface grown as a three-dimensional spiral. That is, the inductor coil 2131 may be in the form of a three-dimensional spiral, and the initial portion (lower portion) of the spiral growth may be electrically connected by the second terminal 2124 and the secondary coil 2122. That is, the inductor coil 2131 may be extended from the other end of the second terminal 2124. An end portion (upper portion) of the spiral growth of the inductor coil 2131 can be electrically connected to the first external terminal 2150 through the bus bar 2140. In this embodiment, the inductor coil 2131 is a three-dimensional spiral having curved lines. However, the shape of the inductor coil 2131 is not limited thereto.

The third terminal 2132 may be a component of the "coil module." The third terminal 2132 may be a member for electrically connecting the inductor coil 2131 to an external terminal. The third terminal 2132 may be a plate-shaped conducting member. The third terminal 2132 may be a shape extended from the above towards the lower side (vertical direction). One end of the third terminal 2132 may be located at the top. The other end of the third terminal 2132 may be located at the lower portion. One end of the third terminal 2132 may be curved or bent and extended in the horizontal direction (direction opposed to the horizontal growth direction of the spiral) at the end portion of the inductor coil 2131. Thereafter, one end of the third terminal 2132 may be curved or bent and extended toward the horizontal direction (from above towards the lower side). The other end of the third terminal 2132 may be curved or bent in the horizontal direction (the direction of the bus bar 2140) and then may be connected to the bus bar 2140. According to the above description, the third terminal 2132 may comprise at least one of a bent portion and a curved portion. In this case, the bent or curved angle of the bent portion or the curved portion may be right angled.

One end of the third terminal 2132 may be electrically connected to the end of the inductor coil 2131. The other end of the third terminal 2132 may be electrically connected to the bus bar 2140. Thus, the inductor coil 2131 can be electrically connected to the bus bar 2140 through the third terminal 2132. The bus bar 2140 is electrically connected to the external terminal 2150 so that the inductor coil 2131 can be electrically connected to the external terminal 2150 through the third terminal 2132 and the bus bar 2140.

An inductor coil 2131 may be disposed in the second magnetic core 2133. The second magnetic core 2133 may be a ferromagnetic member that collects magnetic flux lines of the inductor coil 2131 to increase the strength of the magnetic field. The second magnetic core 2133 may comprise a second bobbin portion 2133*a* and a second support portion 2133*b*. The first support portion 2133*b* is in the form of a block having an inner space at the center, and a second bobbin portion 2133*a* is formed in the inner space to support the inductor coil 2131. The inductor coil 2131 may be wound around the second bobbin portion 2133*a*. The outer surface of the second magnetic core 2133 may be coated with an insulating material. The second magnetic core 2133 may have various shapes according to the request based on the design aspects.

Bus bar 2140 may be a component of a "coil module." The bus bar 2140 may be in the form of an elongated plate extending towards the external terminal 2150. One end of the bus bar 2140 may be electrically connected to the other end of the third terminal 2132. The other end of the bus bar 2140 may be electrically connected to the first external terminal 2150. In this case, the other end of the bus bar 2140 and the first external terminal 2150 may be bolt-coupled together. To this end, a third terminal portion 2140*a* may be formed at the other end of the bus bar 2140. Further, a bolt hole may be formed in the third terminal portion 2140*a*. Therefore, the rectified current of the inductor coil 2131 can be supplied to the external terminal 2150 through the third terminal 2132 and the bus bar 2140.

The external terminal 2150 can be connected to an external electronic device (e.g., a vehicle motor). The external electronic device is connected to the external terminal 2150 to be supplied with a current. Therefore, the external electronic device can be supplied with the current converted in the secondary coil 2122, and rectified by the inductor coil 2131. That is, the external electronic device can be supplied with the rectified and converted current having the rated voltage converted through the secondary coil 2122, and the noise filtered through the inductor coil 2131.

A bidirectional current may flow through the first terminal 2123, the secondary coil 2122, the second terminal 2124, the inductor coil 2131, the third terminal 2132, and the bus bar 2140 that are mentioned above. Therefore, for example, when the electric vehicle travels downhill and the external electronic device (motor) generates electric current like a generator, it may be supplied to the secondary coil 122 through the first terminal 2123, the second terminal 2124, the inductor coil 2131, the third terminal 2132, and the bus bar 2140. In this case, an induction current is generated in the primary coil 2121 so that the external power source device (lithium ion battery) can be charged.

As described above, in the "coil module" of the second embodiment, at least one of the first terminal 2123, the second terminal 2124, and the third terminal 2132 may comprise at least one of a bent portion or a curved portion. This is to provide the "coil module" with a compact and stable support structure.

On the other hand, the plate constituting the "coil module" for a vehicle is a thin and wide plate comprising an upper surface and a lower surface. This is because it is necessary to have a large resistance value in order to handle the electric capacity being supplied to various electronic components of the vehicle. However, when the bent portion or the curved portion is formed by bend forming as described in the comparative embodiment, the bent portion or the curved portion is inevitably worn, damaged or distorted due to the shape of the plate and the characteristics of the forming process. This is undesirable because of the degradation in the electrical properties and durability of the "coil module."

However, since the first terminal 2123, the second terminal 2124 and the third terminal 2132 of the "coil module" according to the second embodiment are formed by "casting," a bent portion or a curved portion having the predetermined shape set at the design step can be formed due to the characteristics of the forming process. Therefore, the "coil module" of the second embodiment can have a compact and stable support structure, and at the same time, the electrical characteristics and durability can be improved.

Figure 14:
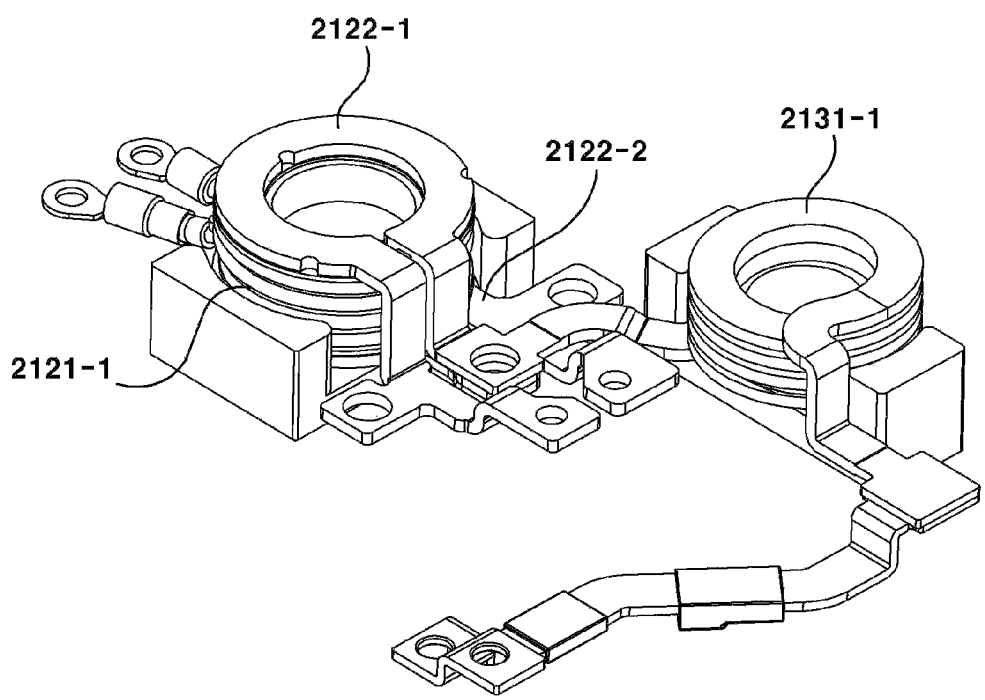
FIG. 14 is a perspective view illustrating a state in which the coil module of a modified embodiment of the second embodiment is mounted on the first magnetic core and the second magnetic core.
Figure 15:
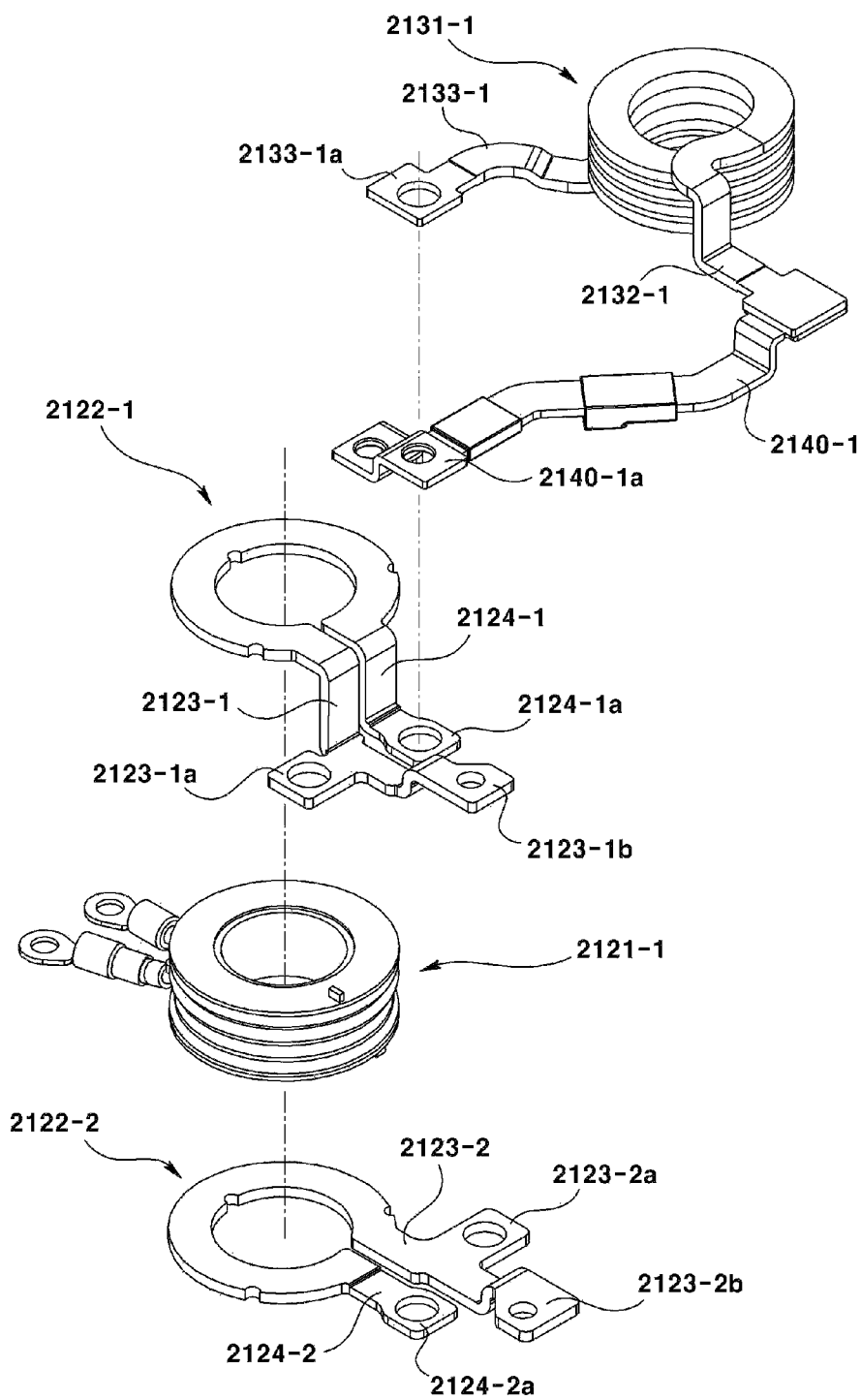
FIG. 15 is an exploded perspective view illustrating a coil module according to the modified embodiment of the second embodiment.

Hereinafter, a modified embodiment of the second embodiment will be described with reference to the drawings. FIG. 14 is a perspective view illustrating a state in which the coil module according to the modified embodiment of the second embodiment is mounted on the first and the second magnetic cores, and FIG. 15 is an exploded perspective view illustrating a coil module according to the modified embodiment of the second embodiment.

The modified embodiment of the second embodiment is different from the second embodiment in the "coil module." The modified embodiment of the second embodiment has substantially the same technical idea as that of the second embodiment other than the above differences. Therefore, the second embodiment can be analogically applied to the modified embodiment of the second embodiment. Hereinafter, description of portions having substantially the same technical ideas as those of the second embodiment will be omitted.

The "coil module" in the modified embodiment of the second embodiment may comprise a conversion unit, an inductor unit, and a bus bar. In this case, the conversion unit comprises a primary coil 2121-1, a secondary coil 2122-1, a tertiary coil 2122-2, a first terminal 2123-1, a second terminal 2124-1, a third terminal 2124-2, and a fourth terminal 2123-2. The inductor unit may comprise an inductor coil 2131-1, a fifth terminal 2133-1, and a sixth terminal 2132-1. The most important feature in the modified embodiment of the second embodiment is that the coils where the induced current caused by the primary coil flows through are the secondary coil and the tertiary coil, that is, a total of two.

The primary coil 2121-1 can be supplied with current from the external power supply device. The primary coil 2121-1 is in the form of a three-dimensional spiral, and the initial portion of the spiral growth can be electrically connected to a first case terminal 2100*a* through the conducting member. The end portion of the spiral growth of the primary coil 2121-1 can be electrically connected to a second case terminal 2100*b* by the conductive line.

The secondary coil 2122-1 may be disposed apart from the primary coil 2121-1. The secondary coil 2122-1 may be located above the primary coil 2121-1. The secondary coil 2122-1 may electromagnetically interact with the primary coil 2121-1. In the secondary coil 2122-1, a current is induced by the current of the primary coil 212-11 so that an induced current may be generated. The induced current generated in the secondary coil 2122-1 may be a current that is boosted or lowered by the current flowing through the primary coil 2121-1.

The secondary coil 2122-1 may have the shape of an open ring-type plate comprising an upper surface and a lower surface. The initial portion (one end) of the secondary coil 2122-1 may be a shape extended from the first terminal 2123-1. The end portion (other end) of the secondary coil 2122-1 may be connected to the second terminal 2124-1. That is, one end of the secondary coil 2122-1 may be electrically connected to the first terminal 2123-1, and the other end of the secondary coil 2122-1 may be electrically connected to the second terminal 2124-1. The secondary coil 2122-1 and the first and the second terminals 2123-1 and 2124-1 may be integrally formed. However, the shape of the secondary coil 2122-1 is not limited to the ring-type as described above. For example, the secondary coil 2122-1 may be disposed in a three-dimensional spiral shape, spaced vertically or horizontally from the primary coil 2121-1. In addition, the secondary coil 2122-1 may be a three-dimensional spiral shape interleaving with the primary coil 2121-1 while being spaced apart from each other. In this case, the primary and the secondary coils 2121-1 and 2122-1 can be formed into one double-layered three-dimensional spiral.

The first terminal 2123-1 may be a member for electrically connecting the secondary coil 2122-1 to an external terminal. The first terminal 2123-1 may be a plate-shaped conducting member. The first terminal 2123-1 may be a shape extended from the above towards the lower side (vertical direction). One end of the first terminal 2123-1 may be located at the top. The other end of the first terminal 2123-1 may be located at the lower portion. One end of the first terminal 123-1 may be curved or bent and extended in the vertical direction at the initial portion of the secondary coil 2122-1. The other end of the first terminal 2123-1 may be curved or bent in the horizontal direction and then divided into a first and a second terminal portions 2123-1*a* and 2123-1*b* which will be described later. According to the above description, the first terminal 2123-1 may comprise at least one of a bent portion and a curved portion. In this case, the bent or curved angle of the bent portion or the curved portion may be right angled.

One end of the first terminal 2123-1 may be electrically connected to the initial portion of the secondary coil 2122-1. The other end of the first terminal 2123-1 can be divided into a first terminal portion 2123-1*a* and a second terminal portion 2123-1*b*. The first terminal portion 2123-1*a* may be electrically connected to the third case terminal 2100-1*c* by bolt-coupling. Therefore, a hole for bolt-coupling may be formed on the first terminal portion 2123-1*a*. And the second terminal portion 2123-1*b* may be electrically connected to the fourth case terminal 2110-1*d* by bolt-coupling. Therefore, a hole for bolt-coupling may be formed on the second terminal portion 2123-1*b*. The third case terminal 2110-1*c* and the fourth case terminal 2100-1*c* may be electrically connected to a diode module (not shown). Accordingly, the secondary coil 2122-1 can be electrically connected to the diode module through the first terminal 2123-1.

The second terminal 2124-1 may be extended from the secondary coil 2122-1. The second terminal 2124-1 may be a member for electrically connecting the secondary coil 2122-1 and the inductor coil 2131-1. The second terminal 2124-1 may be a plate-shaped conducting member. The second terminal 2124-1 may be a shape extended from the above towards the lower side (vertical direction), and then extended in the horizontal direction. One end of the second terminal 2124-1 may be curved or bent and extended in the vertical direction at the end portion of the secondary coil 2122-1. The middle portion of the second terminal 2124-1 may be a shape downwardly extended. The other end of the second terminal 2124-1 may be in the shape of a plate bent or curved in a horizontal direction at the middle portion of the second terminal 2124-1. A third terminal portion 2124-1a may be formed at the other end of the second terminal 2124-1. The third terminal portion 2124-1a may be electrically connected to the seventh terminal portion 2133-1a by bolt-coupling. The third terminal portion 2124-1a may be formed with a hole for bolt-coupling. Accordingly, the second terminal 2124-1 and the fifth terminal 2133-1 can be electrically connected to each other. Eventually, the secondary coil 2122-1 and the inductor coil 2131-1 are electrically connected to each other. According to the above description, the second terminal 2124-1 may comprise at least one of a bent portion and a curved portion. In this case, the bent or curved angle of the bent portion or the curved portion may be right angled.

The tertiary coil 2122-2 may be disposed apart from the primary coil 2121-1. The tertiary coil 2122-2 may be positioned below the primary coil 2121-1. The tertiary coil 2122-2 can electromagnetically interact with the primary coil 2121-1. In the tertiary coil 2122-2, a current is induced by the current of the primary coil 212-11 so that an induced current may be generated. The induced current generated in the tertiary coil 2122-2 may be a current that is boosted or lowered by the current flowing through the primary coil 2121.

The tertiary coil 2122-2 may have the shape of an open ring-type plate comprising an upper surface and a lower surface. The initial portion (one end) of the tertiary coil 2122-2 may be a shape extended from the third terminal 2123-2. The end portion (other end) of the tertiary coil 2122-2 may be connected to the fourth terminal 2124-2. That is, one end of the tertiary coil 2122-2 may be electrically connected to the fourth terminal 2123-2, and the other end of the tertiary coil 2122-2 may be electrically connected to the third terminal 2124-2. The tertiary coil 2122-2 and the third and fourth terminals 2123-2 and 2124-2 may be integrally formed. However, the shape of the tertiary coil 2122-2 is not limited to the above described ring-type. For example, the tertiary coil 2122-2 may be disposed in a three-dimensional spiral shape, spaced apart from the primary coil 2121-1 in a vertical or horizontal direction. Further, the tertiary coil 2122-2 may be a three-dimensional spiral shape interleaving with the primary coil 2121-1 while being spaced apart from each other. In this case, the primary coil and the tertiary coil 2121-1 and 2122-2 may be formed into one double-layered three-dimensional spiral.

The third terminal 2123-2 may be a member for electrically connecting the tertiary coil 2122-2 to the diode module. The third terminal 2123-2 may be a plate-shaped conducting member. The third terminal 2123-2 may be a shape extending horizontally at one end (initial portion) of the tertiary coil 2122-2. The other end of the third terminal 2123-2 can be divided into a fourth and a fifth terminal portions 2123-2a and 2123-2b which will be described later.

One end of the third terminal 2123-2 may be electrically connected to the initial portion of the tertiary coil 2122-2. The other end of the third terminal 2123-2 can be divided into a fourth terminal portion 2123-2a and a fifth terminal portion 2123-2b. The fourth terminal portion 2123-2a and the fifth terminal portion 2123-2b may be electrically connected to the diode module through bolt-coupling. Accordingly, the fourth terminal portion 2123-1a and the fifth terminal portion 2123-2b may be formed with holes for bolt-coupling. Accordingly, the tertiary coil 2122-2 may be electrically connected to the diode module through the third terminal 2123-2.

The fourth terminal 2124-2 may be extended from the tertiary winding 2122-2. The fourth terminal 2124-2 may be a member for electrically connecting the tertiary coil 2122-2 and the inductor coil 2131-1. The fourth terminal 2124-2 may be a plate-shaped conducting member. The fourth terminal 2124-2 may be a shape extending horizontally at the other end of the tertiary coil 2122-2. One end of the fourth terminal 2124-2 may be located at the end portion of the tertiary coil 2122-2. A sixth terminal portion 2124-2a may be formed at the other end of the fourth terminal 2124-2. The sixth terminal portion 2124-2a may be electrically connected to the seventh terminal portion 2133-1a through bolt-coupling. In this case, the third terminal portion 2124-1a, the sixth terminal portion 2124-2a, and the seventh terminal portion 2133-1a may be overlappingly positioned in the vertical direction. The sixth terminal portion 2124-2a may be formed with a hole for bolt-coupling. Accordingly, the fourth terminal 2124-2 and the fifth terminal 2133-1 can be electrically connected, and finally, the tertiary coil 2122-2 and the inductor coil 2131-1 may be electrically connected to each other.

The inductor coil 2131-1 can be supplied with the converted current from the secondary coil 2122-1 and the tertiary coil 2122-2. The inductor coil 2131-1 can rectify the converted current. The inductor coil 2131-1 may be connected to the external terminal 2150 to supply a rectified current.

The inductor coil 2131-1 may have a shape of a plate comprising an upper surface and a lower surface grown as a three-dimensional spiral. That is, the inductor coil 2131-1 may be in the form of a three-dimensional spiral, and the initial portion (lower portion) of the spiral growth of the inductor coil 2131-1 may be extended from the fifth terminal 2133-1. The sixth terminal 2132-1 may be connected to the end portion (upper portion) of the spiral growth of the inductor coil 2131-1. The bus bar 2140-1 may extend from the sixth terminal 2132-1. The inductor coil 2131-1, the fifth terminal 2133-1, the sixth terminal 2132-1, and the bus bar 2140-1 may be integrally formed.

The seventh terminal portion 2133-1a may be formed at one end of the fifth terminal 2133-1. As described above, the seventh terminal portion 2133-1a may be electrically connected to the third terminal portion 2124-1a through bolt-coupling. In addition, the seventh terminal portion 2133-1a may be electrically connected to the sixth terminal portion 2124-2a through bolt-coupling. Therefore, the inductor coil 2131-1 may be electrically connected to the secondary coil 2122-1 and the tertiary coil 2122-2. The induced current generated in the secondary coil 2122-1 and the tertiary coil 2122-2 can be rectified in the inductor coil 2131-2. The other end of the fifth terminal 2133-1 may be extended in the horizontal direction (direction in which the inductor coil is positioned) at one end of the fifth terminal 2133-1, and may be connected to the initial portion of the spiral growth of the inductor coil 2131-2.

One end of the sixth terminal 2132-1 may be connected to the end portion of the spiral growth of the inductor coil 2131-2. The other end of the sixth terminal 2132-1 may be connected to one end of the bus bar 2140-1. The other end of the bus bar 2140-1 may be electrically connected to an external terminal 2150. An eighth terminal portion 2140-1*a* may be formed at the other end of the bus bar 2140-1 to electrically connect to the external terminal 2150. The eighth terminal portion 2140-1*a* may be formed with a bolt-coupling hole for fixing and electrical connection. The inductor coil 2131-2 may be electrically connected to the external terminal 2150 through the bus bar 2140-1. As a result, an induction current generated in the secondary coil 2122-1 and the tertiary coil 2122-2 are rectified in the inductor coil 2131-2, and then, may be transmitted to an external electronic device through the bus bar 2140-1.

Third Embodiment

Figure 16:
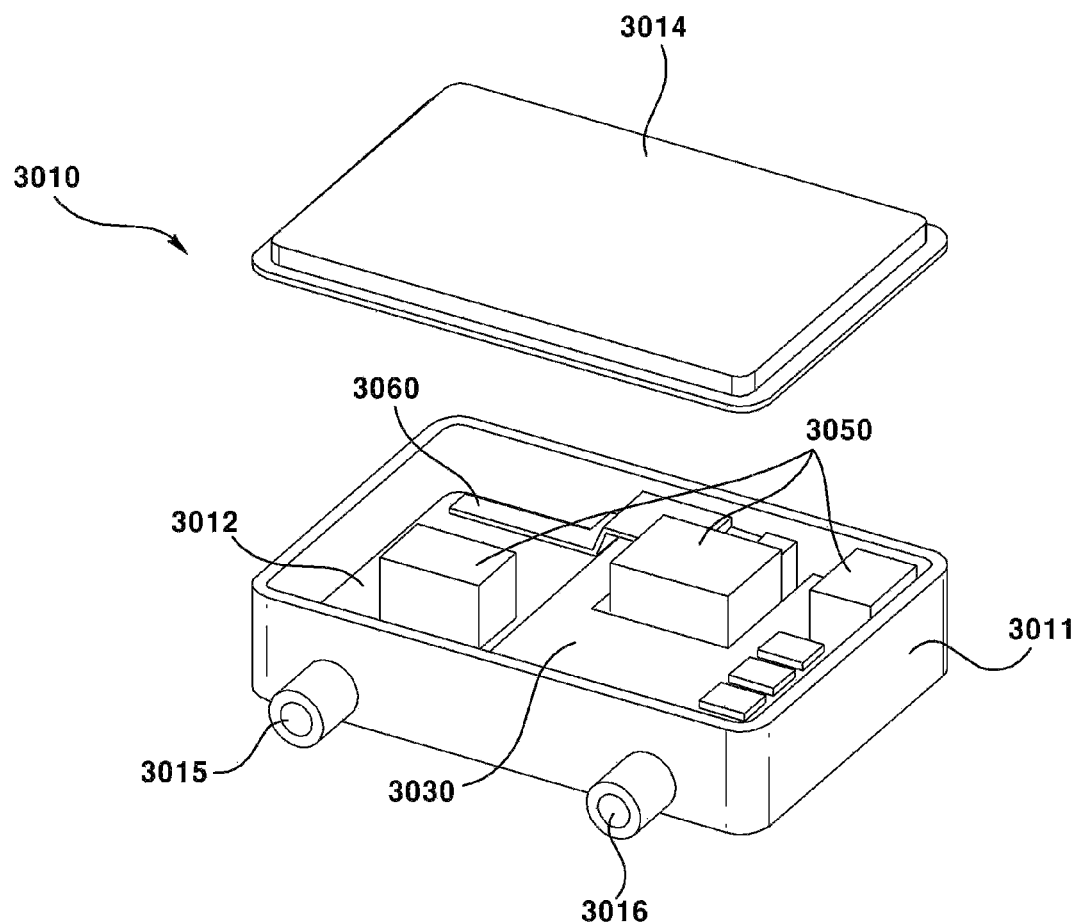
FIG. 16 is a perspective view illustrating the DC-DC converter of the third embodiment with the first cover removed.
Figure 17:
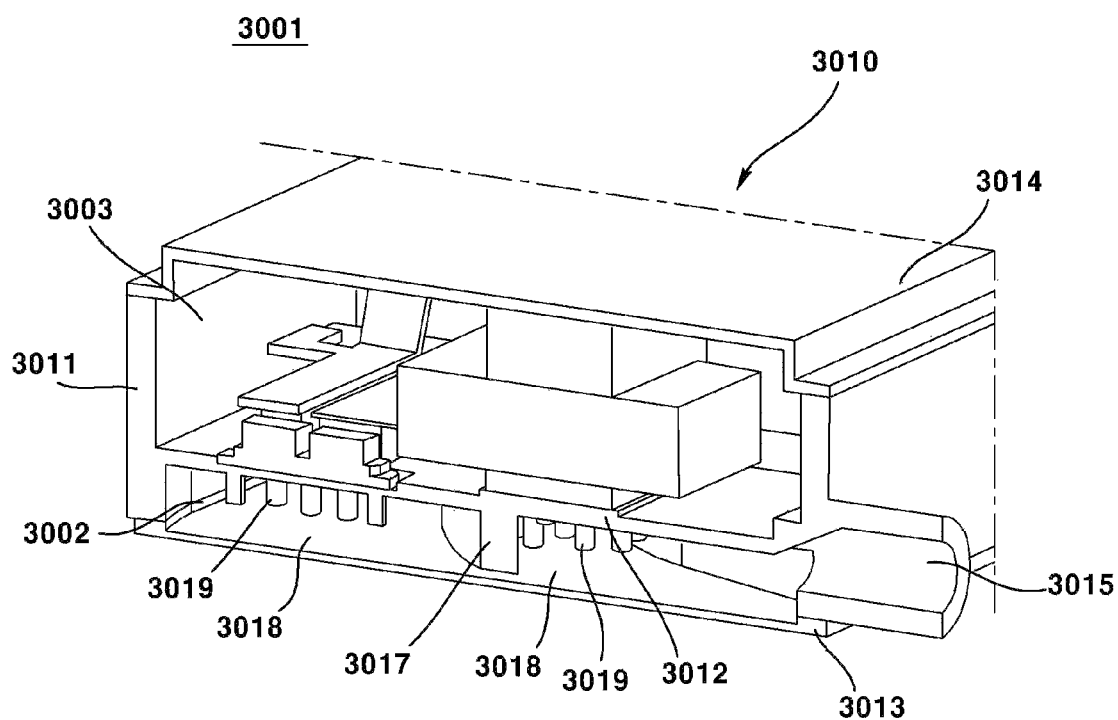
FIG. 17 is a cut-away perspective view illustrating the DC-DC converter of the third embodiment.
Figure 18:
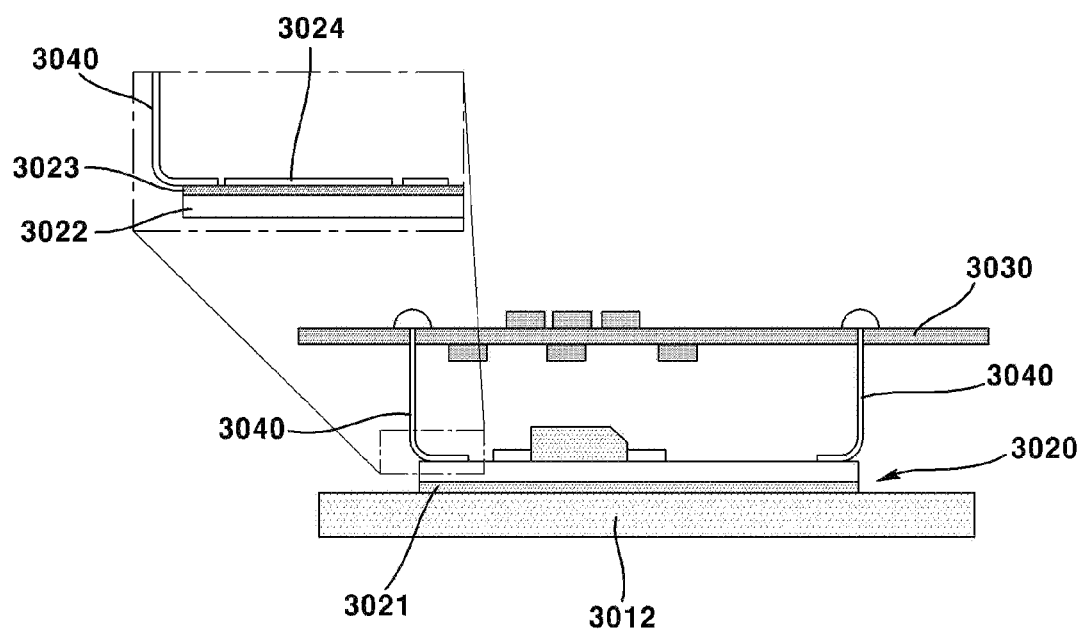
FIG. 18 is a cross sectional conceptual view illustrating a main board, an auxiliary board and a cooling plate of the DC-DC converter of the third embodiment.
Figure 19:
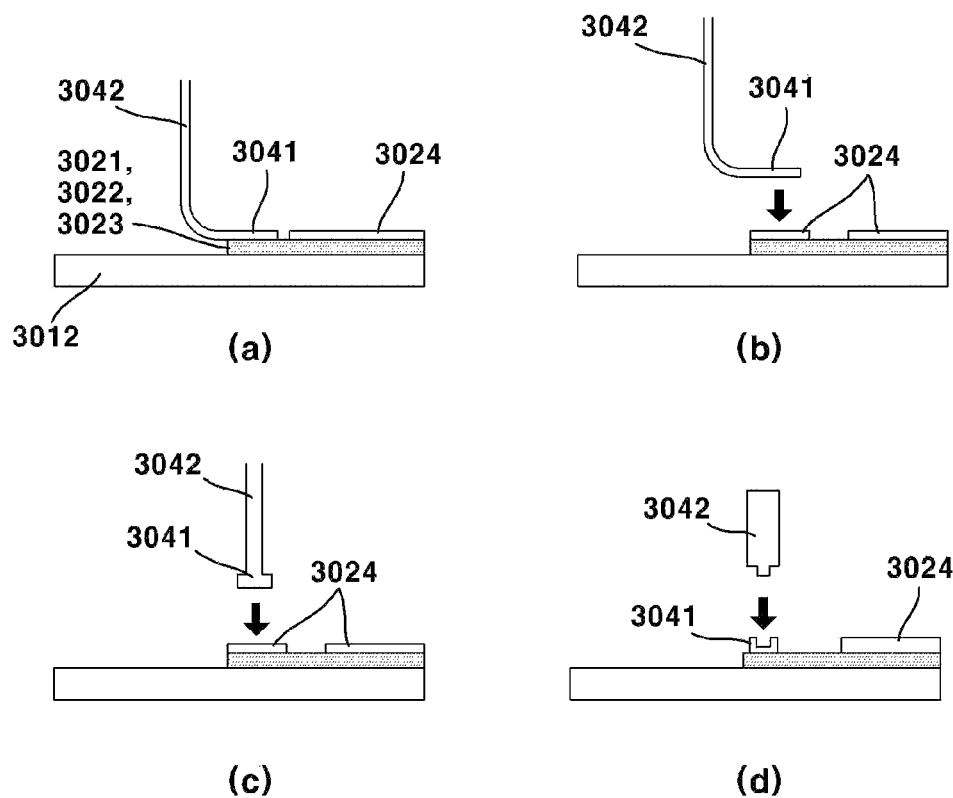
FIG. 19 is a conceptual diagram illustrating a signal leg of the DC-DC converter of the third embodiment.

Hereinafter, the DC-DC converter 3001 of the third embodiment will be described with reference to the drawings. FIG. 16 is a perspective view illustrating the DC-DC converter of the third embodiment with the first cover removed; FIG. 17 is a cut-away perspective view illustrating the DC-DC converter of the third embodiment; FIG. 18 is a cross sectional conceptual view illustrating a main board, an auxiliary board and a cooling plate of the DC-DC converter of the third embodiment; and FIG. 19 is a conceptual diagram illustrating a signal leg of the DC-DC converter of the third embodiment.

A DC-DC converter 3001 of the third embodiment may be a DC-DC converter used in a vehicle. For example, the DC-DC converter 1000 may play the role of receiving an electric current from an external power supply device (such as a lithium ion battery), boosting or lowering a voltage, supplying the voltage to an external electronic device (such as a motor), and thereby controlling the number of revolutions of a motor and the like. As illustrated in FIG. 17, the DC-DC converter 3001 may comprise a housing 3010, a first board 3020, a second board 3030, a connecting member 3040, a coil unit 3050, and a bus bar 3060. DC-DC converter 3001 may be referred to as an "electronic component assembly." In this case, auxiliary configuration such as the coil unit 3050 and the bus bar 3060 may be omitted. In this case, the scope of rights of "electronic component assembly" of the third embodiment may be extended to various electronic component assemblies as well as the DC-DC converter 3001. Further, the first board 3020 is a board provided for cooling a device having a high heating value and may be referred to as an "auxiliary board." Since the first board 3020 has a configuration completely different from that of a general board (the cooling plate plays the role of a base of a general board), the name of the board may be omitted. The second board 3030 may be referred to as "main board" as a board provided to cool a device having a low heating value. When the designation of the first board 3020 is omitted, the second board 3030 may be referred to as a "board."

Hereinafter, the housing 3010 will be described with reference to FIGS. 16 and 17. Housing 3010 is an exterior member of DC-DC converter 3001 and may be in the form of a hollow block. The housing 3010 may comprises a main body 3011, a cooling plate 3012, a first cover 3013, a second cover 3014, an inlet 3015, an outlet 3016, a cooling flow path guide 3017, a cooling flow path 3018 and a heat radiating fin 3019. The inside of the housing 3010 can be divided into a first area 3002 located at the lower portion by the cooling plate 3012 and a second area 3003 located at the upper portion. The first region 3002 may be a cooling portion through which the cooling fluid flows, and the second region 3003 may be an electronic component portion where electronic components are disposed. The cooling plate 3012, the first cover 3013, the second cover 3014, the inlet 3015 and the outlet 3016 of the housing 3010, the cooling flow path guide 3017, the cooling flow path 3018, and the heat radiating fin 3019 may be integrally formed. The material of the housing 3010 may be a metal (for example, aluminum).

The main body 3011 may be formed by a side surface, and may have a hollow shape wherein a lower end portion and an upper end portion thereof are open. The first cover 3013 may be disposed at the lower end portion of the main body 3011. In this case, the first cover 3013 can cover and close the opening of the lower end portion of the main body 3011. A second cover 3014 may be disposed on the upper end portion of the main body 3011. In this case, the second cover 3013 can cover and close the opening of the upper end portion of the main body 3011. As a result, the inner space of the housing 3010 can be formed by the main body 3011 and the first and the second covers 3012 and 3013. Furthermore, a cooling plate 3012 may be disposed in the interior of the main body 3011 in the form of a horizontal partition. That is, the cooling plate 3012 may be formed over the entire surface of the horizontal cross section inside the main body 3011. The cooling plate 3012 can divide or separate the inside of the main body 3011 into a first region 3002 and a second region 3003. In this case, the first region 3002 and the second region 3003 may be the separate regions isolated from each other. The first region 3002 may be disposed below the cooling plate 3012 and the second region 3003 may be disposed above the cooling plate 3012.

An inlet 3015 for introducing the cooling fluid and an outlet 3016 for discharging the cooling fluid that has flowed along the first region 3002 are formed in a portion corresponding to the first region 3002 on the side surface of the main body 3011.

The first region 3002 can perform a cooling function in a region where the cooling fluid flows. A cooling flow path guide 3017 can be disposed on the lower side surface of the cooling plate 3012. In this case, the cooling flow path guide 3017 can have various shapes, and the cooling flow path 3018 can be formed by the cooling flow path guide 3017. A plurality of heat radiating fins 3019 may be formed in the cooling flow path 3018 to increase the cooling efficiency. In this case, the plurality of heat radiating fins 3019 may be in the form of protrusions downwardly extending from the lower surface of the cooling plate 3012.

The second region 3003 disposed with the electronic components can perform an electronic control function. For this, a first board 3020, a second board 3030, a connecting member 3040, a coil unit 3050, and a bus bar 3060 may be disposed in the second region 3003.

Hereinafter, the first board 3020 will be described with reference to FIG. 18. The first board 3020 may be a metal printed circuit board (MPCB) having a high heating value. The first board 3020 can be referred to as an "auxiliary board" as a board for mounting a device having a high heating value. That is, the device mounted on the first board 3020 has a higher heating value than the device mounted on the second board 3030, which will be described later. An element mounted on the first board 3020 may also be referred to as an "active element." Here, the "active element" may be an element capable of generating electric energy. For example, a transistor and an IC controller may correspond to this.

The first board 3020 may be disposed on the upper surface of the cooling plate 3012. In this case, the lower surface of the first board 3020 can contact the upper surface of the cooling plate 3012. As a result, the cooling efficiency of the first board 3020 may be higher than that of the second board 3030, which will be described later. Since the lower surface of the first board 3020 is in direct contact with the cooling plate 3012, the element can be mounted only on the upper surface of the first board 3020. The first board 3020 may be downwardly spaced apart from the second board 3030. That is, the first board 3020 may be stacked with the second board 3030 spaced apart from each other. As a result, in the third embodiment, the device mounting rate can be increased in the same space. The area of the first board 3020 may be smaller than the area of the second board 3030. The first board 3020 may be electrically connected to the second board 3030. The first board 3020 may be electrically connected to the second board 3030 by a connecting member 3040.

The first board 3020 may comprise an adhesive layer 3021, a metal layer 3022, an insulating layer 3023, and a pattern layer 3024. The first board 3020 may be a shape wherein an adhesive layer 3021, a metal layer 3022, an insulating layer 3023, and a pattern layer 3024 are sequentially stacked. The first board 3020 may be configured to be consisted of only the adhesive layer 3021, the metal layer 3022, the insulating layer 3023, and the pattern layer 3024.

The adhesive layer 3021 which is a thermally conductive adhesive may be disposed on the cooling plate 3012. In this case, the adhesive layer 3021 can be directly coated on the upper surface of the cooling plate 3012. That is, the adhesive layer 3021 can adhere to the upper surface of the cooling plate 3012. For example, the adhesive layer 3021 may be a thermal grease having a high thermal conductivity. As a result, it is possible to efficiently cool the heat generated in the element having a high heating value to be mounted on the first board 3020. Further, the adhesive layer 3021 can perform the function of coupling the metal layer 3022 and the cooling plate 3012.

The metal layer 3022 may be disposed on the adhesive layer 3021. That is, the metal layer 3022 may be disposed on the adhesive layer 3021. The metal layer 3022 may be in the form of a metal plate. The lower surface of the metal layer 3022 can be bonded with the upper surface of the adhesive layer 3021. The material of the metal layer 3022 may comprise copper or aluminum having a high thermal conductivity. The first board 3020 with the metal layer 3022 may be referred to as a "metal printed circuit board." The cooling efficiency of the first board 3020 can be increased by the metal layer 3022. In addition, the metal layer 3022 may serve as a supporting portion in the first board 3020. The insulating layer 3023 and the pattern layer 3024 can be supported by the metal layer 3022.

An insulating layer 3023 may be disposed over the metal layer 3022. That is, the insulating layer 3023 may be disposed on the metal layer 3022. The insulating layer 3023 may be in the form of a plate made of an insulating material. The insulating layer 3023 may be a layer for forming the pattern layer 3024.

The pattern layer 3024 may be disposed on the insulating layer 3023. The pattern layer 3024 may be coated on the insulating layer 3023. The pattern layer 3024 may be a layer forming a circuit of the first board 3020. Thus, the pattern layer 3024 can be various circuit patterns that are electrically conductive materials. An "active element" may be disposed in the pattern layer 3024. In this case, the "active element" may comprise an upper surface and a lower surface. The lower surface of the "active element" can be soldered to the pattern layer 3024. Therefore, the lower surface of the "active element" can face the cooling plate 3012. The "active element" may be electrically connected to the pattern layer 3024 by surface mount technology (SMT). For example, the "active element" may be electrically connected to the pattern layer 3024 by a plurality of wires.

As described above, the first board 3020 is completely different from a general board in that the first board 3020 is composed of materials coated directly on the cooling plate 3012 with the cooling plate 3012 as a base. Thus, the name of the first board 3020 may be omitted. In this case, the first board 3020 may be referred to as an "adhesive layer 3021, metal layer 3022, insulating layer 3023, and pattern layer 3024."

Hereinafter, the second board 3030 will be described with reference to FIG. 18. The second board 3030 may be a printed circuit board (PCB). The second board 3030 as a board for mounting a device having a low heating value may be referred to as a "main board." That is, the device mounted on the second board 3030 has a lower heating value than the device mounted on the first board 3020. The element mounted on the second board 3030 may also be referred to as a "passive element." Here, the "passive device" may be an element that transmits or absorbs electrical energy but does not have an active function, such as conversion of electrical energy.

The second board 3030 may be upwardly spaced apart from the cooling plate 3012. To this end, a member (not shown) for supporting the second board 3030 may be disposed on the inner side surface of the second region 3003 of the main body 3011. The first board 3020 may be disposed between the second board 3030 and the cooling plate 3012. That is, the second board 3030 and the first board 3020 may be overlappingly spaced apart from each other. As a result, the cooling efficiency of the second board 3030 may be lower than that of the first board 3020. That is, the second board 3030 may be stacked spaced apart from the first board 3020. In this case, the area of the second board 3030 may be larger than the area of the first board 3020. The second board 3030 may be electrically connected to the first board 3020. The second board 3030 may be electrically connected to the first board 3020 by a connecting member 3040. The second board 3030 may be disposed spaced apart from the coil unit 3050 which will be described later. In this case, the coil unit 3050 can penetrate the first board 3020. Since the coil unit 3050 is supported on the cooling plate 3012 and the first board 3020 is upwardly disposed spaced apart from the cooling plate 3012, a hole may be formed in the first board 3020 at the portion where the first board 3020 and the coil unit 3050 are overlapped with each other so that the coil unit 3050 can penetrate therethrough. (Refer to FIG. 16)

The connecting member 3040 can electrically connect the first board 3020 and the second board 3030. The connecting member 3040 may be a coupling member made by a press-fit method. Also, the connecting member 3040 may be a signal leg. The connecting member 3040 may be a flexible printed circuit board (FPCB). That is, the connecting member 3040 can be in various forms. Hereinafter, the case wherein the connecting member 3040 is a signal leg will be described with reference to FIG. 20.

As illustrated in FIG. 19 (a), the connecting member 3040 may comprise a first conducting member 3041 and a second conducting member 3042 which is electrically connected to the second board 3030 by being bent or curved at the first conducting member 3041. In this case, the first conducting member 3041 may be a pattern of the pattern layer 3024. The second conducting member 3042 may upwardly extend from the first conducting member 3041 to be electrically connected to the second board 3030. In this case, the upper end of the second conducting member 3042 can be coupled to the second board 3030 by soldering, pin bonding or the like.

As illustrated in FIG. 19 (b), the connecting member 3040 may comprise a first conducting member 3041 which is electrically connected to the pattern layer 3024, and a second conducting member 3042 which is bent or curved at the first conducting member 3041 and electrically connected to the second conducting member 3030. In this case, the lower surface of the first conducting member 3041 may be electrically connected to the pattern layer 3024. The lower surface of the first conducting member 3041 can be bonded to the pattern layer 3024 by soldering or pin bonding or the like. The second conducting member 3042 may upwardly extend from the first conducting member 3041 to be electrically connected to the second board 3030. The upper end portion of the second conducting member 3042 can be bonded to the second board 3030 by soldering or pin bonding or the like.

As illustrated in FIG. 19 (c), the connection member 3040 may comprise: a first conducting member 3041 having the shape of a plate and electrically connected to the pattern layer 3024; and a second conducting member 3042 extended from the center of the first conducting member 3041 towards the second board 3030. In this case, the lower surface of the first conducting member 3041 may be electrically connected to the pattern layer 3024. The lower surface of the first conducting member 3041 can be bonded to the pattern layer 3024 by soldering or pin bonding or the like. The second conducting member 3042 may be upwardly extended from the first conducting member 3041 to be electrically connected to the second board 3030. The upper end of the second conducting member 3042 can be bonded to the second board 3030 by soldering or pin bonding or the like.

As illustrated in FIG. 19 (d), the connecting member 3040 may comprise: a first conducting member 3041 having the shape of a plate with a groove at the center thereof and forming a portion of the pattern layer 3024; and a second conducting member 3042 formed with a protruding part being accommodated in the groove of the first conducting member, and extended from the protruding part toward the second board 3030 and electrically connected to the second board 3030. In this case, the first conducting member 3041 may be a pattern of the pattern layer 3024. A protruding part corresponding to the groove of the first conducting member 3041 may be formed on the lower end portion of the second conducting member 3042 and may be soldered thereto. As a result, the second conducting member 3042 can be electrically connected to the first conducting member and, at the same time, can be supported by the first conducting member 3041. The second conducting member 3042 may be upwardly extended from the first conducting member 3041 to be electrically connected to the second board 3030. The upper end of the second conducting member 3042 can be bonded to the second board 3030 by soldering or pin bonding or the like.

As described above, the "active element" is disposed on the first board 3020 and the "passive element" is disposed on the second board 3030. However, the third embodiment is not limited to this. The "active element" and the "passive element" may be collectively referred to as an "electronic element." The "electronic element" may be disposed on the first board 3020 and the second board 3030 without distinguishing between the "active element" and the "passive element."

Hereinafter, the coil unit 3050 and the bus bar 3060 will be described with reference to FIG. 16. The coil unit 3050 can be supported on the cooling plate 3012. In this case, the lower portion of the coil unit 3050 can be bonded with the upper surface of the cooling plate 3012. In addition, the coil unit 3050 can be disposed spaced apart from the second board 3030. In addition, the coil unit 3050 can be overlappingly disposed with the second board 3030. In this case, the coil unit 3050 can penetrate the second board 3030. The coil unit 3050 may be plural. The coil unit 3050 may be a trans-coil unit or an inductor coil unit. When the coil unit 3050 is the trans-coil unit, the coil unit 3050 can convert the voltage of the power source supplied from the outside. When the coil unit 3050 is the inductor coil unit, the coil unit 3050 can rectify the converted power. The bus bar 3050 may be electrically connected to the coil unit 3050 to output the converted and/or rectified power to the outside.

Figure 20:
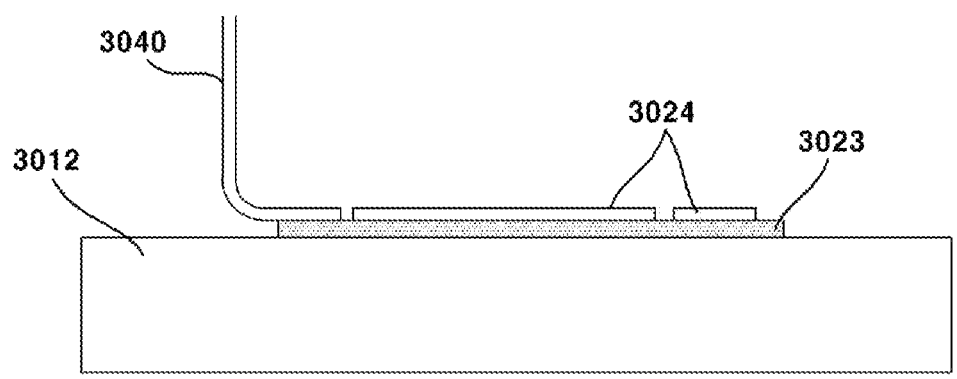
FIG. 20 is a cross sectional conceptual diagram illustrating a main board, an auxiliary board and a cooling plate respectively of a DC-DC converter according to a modified embodiment of the third embodiment.

Hereinafter, a DC-DC converter 1 according to a modified embodiment of the third embodiment will be described with reference to the drawings. FIG. 20 is a cross sectional conceptual diagram illustrating a main board, an auxiliary board and a cooling plate of a DC-DC converter according to the modified embodiment of the third embodiment. The modified embodiment of the third embodiment has the same technical idea as that of the third embodiment except for the first board 3020. Hereinafter, description of technical ideas substantially the same as those of the third embodiment will be omitted.

The first board of the modified embodiment of the third embodiment may comprise an insulating layer 3023 and a pattern layer 3024. The first board may be a shape wherein an insulating layer 3023 and a pattern layer 3024 are sequentially stacked. The first board may be composed of only the insulating layer 3023 and the pattern layer 3024.

That is, in the modified embodiment of the third embodiment, the adhesive layer 3021 and the metal layer 3022 may be omitted. Instead, the cooling plate 3012 can perform the function of the metal layer 3022. Therefore, the adhesive layer 3021 for bonding the metal layer 3022 and the cooling plate 3012 may also be omitted.

More specifically, the insulating layer 3023 of the first board may be directly coated on the top surface of the cooling plate 3012. That is, the insulating layer 3023 and the upper surface of the cooling plate 3012 can be in contact with each other. In this case, the cooling plate 3012 made of a metal material can perform the function of supporting the metal layer 3022 of the third embodiment. That is, the first board of the modified embodiment of the third embodiment can achieve the same effect as the first board 3020 of the third embodiment. At the same time, since the adhesive layer 3021 and the metal layer 3022 are removed, the cooling efficiency can be improved, and it is possible to solve the problem of ensuring a space in the vertical direction, which becomes possible by mounting the element on the lower surface of the second board 3030 owing to the size reduction in the vertical direction.

In the above, to have been described as all the components that make up the embodiments of the present invention may operate in combination, or combined into one, but the invention is not necessarily limited to these examples. That is, if the object in the scope of the present invention, may be that all of the components are selectively operates in conjunction with more than one. In addition, terms such as "inclusive and", "is configured" or "have" described above is because, which means that unless there is a particular of stated that, the component can be embedded, except for the different components it should not be construed to further comprise other components. All terms, including technical and scientific terms, have the same meaning as commonly understood by one of ordinary skill in the art to which this invention belongs, unless otherwise defined. Commonly used terms, such as predefined terms, should be interpreted to be consistent with the contextual meanings of the related art, and are not to be construed as ideal or excessively formalistic, unless expressly defined to the contrary.

The above description is only to those described as the technical idea of the present invention by way of example, those skilled in the art that various modifications, additions and substitutions will be possible without departing from the essential characteristics of the present invention. Accordingly, the disclosed invention embodiments is for illustrative and not intended to limit the technical idea of the present invention, not by such an embodiment is the technical scope of the present invention is not limited. The scope of protection of the invention is to be interpreted by the following claims, all spirits within a scope equivalent will be construed as included in the scope of the present invention.

The invention claimed is:

1. A DC-DC converter comprising:
   a housing with a cooling plate;
   a cooling passage disposed on one surface of the cooling plate;
   an insulating layer disposed on an other surface of the cooling plate;
   a pattern layer disposed on the insulating layer;
   an electric device disposed on the pattern layer; and
   a substrate spaced apart from the cooling plate and electrically connected to the pattern layer.

2. The DC-DC converter according to claim 1, wherein the electric device includes an upper surface and a lower surface, and
   wherein the lower surface of the electric device is soldered to the pattern layer to face the cooling plate.

3. The DC-DC converter according to claim 1, wherein the cooling plate is integrally formed with the housing.

4. The DC-DC converter according to claim 1, wherein a plurality of heat dissipation fins are formed on one surface of the cooling plate, and the plurality of heat dissipation fins have a protrusion shape extending to one side of the cooling plate.

5. The DC-DC converter according to claim 1, comprising:
   a first substrate disposed on the upper surface of the cooling plate; and
   a second substrate disposed to be spaced apart from the cooling plate on the upper side.

6. The DC-DC converter according to claim 5, wherein the first substrate and the second substrate are electrically connected to each other by soldering a signal bridge or by a press-fit method.

7. The DC-DC converter according to claim 6, wherein the signal bridge includes:
   a first conductive member forming a part of the pattern layer; and
   a second conductive member that is curved or bent in the first conductive member and is electrically connected to the substrate.

8. The DC-DC converter according to claim 6, wherein the signal bridge includes:
   a first conductive member electrically connected to the pattern layer; and
   a second conductive member that is curved or bent in the first conductive member and is electrically connected to the substrate.

9. The DC-DC converter according to claim 6, wherein the signal bridge includes:
   a first conductive member electrically connected to the pattern layer and having a plate shape; and
   a second conductive member extending from the center of the first conductive member toward the second substrate and electrically connected to the substrate.

10. The DC-DC converter according to claim 6, wherein the signal bridge includes:
    a first conductive member forming a part of the pattern layer and having a plate shape and a groove formed in the center; and
    a second conductive member having a protrusion accommodated in the groove of the first conductive member and extending from the protrusion toward the substrate to be electrically connected to the substrate.

11. The DC-DC converter according to claim 1, wherein one end and an other end of the housing are open, and
    wherein the housing includes a first cover covering an opening of the one end and a second cover covering an opening of the other end.

12. The DC-DC converter according to claim 1, wherein the insulating layer is coated on the other surface of the cooling plate.

13. A DC-DC converter comprising:
    a housing comprising a first area in which a flow path of a cooling fluid is formed and a second area separated from the first area in which electronic components are disposed and a cooling plate disposed between the first and second areas;
    a main board spaced apart from the cooling plate and disposed in the second area;
    an insulating layer disposed on the cooling plate;
    a pattern layer disposed on the insulating layer; and
    an electric device disposed on the pattern layer.

* * * * *

UNITED STATES PATENT AND TRADEMARK OFFICE
CERTIFICATE OF CORRECTION

| | | |
|---|---|---|
| PATENT NO. | : 11,575,313 B2 | Page 1 of 1 |
| APPLICATION NO. | : 17/575992 | |
| DATED | : February 7, 2023 | |
| INVENTOR(S) | : Ji Hoon Kim et al. | |

It is certified that error appears in the above-identified patent and that said Letters Patent is hereby corrected as shown below:

On the Title Page

Please insert Item (30) as follows:
--(30) Foreign Application Priority Data
November 17, 2016 (KR) 10-2016-0153088
December 28, 2016 (KR) 10-2016-0180862
November 9, 2017 (KR) 10-2017-0148773
November 16, 2017 (KR) 10-2017-0152770
November 16, 2017 (KR) 10-2017-0152771--

Signed and Sealed this
Fourth Day of April, 2023

Katherine Kelly Vidal
*Director of the United States Patent and Trademark Office*